(12) United States Patent
Mukhanov et al.

(10) Patent No.: US 11,906,877 B2
(45) Date of Patent: Feb. 20, 2024

(54) SUPERCONDUCTING OPTICAL-TO-DIGITAL CONVERTER

(71) Applicant: SeeQC Inc., Elmsford, NY (US)

(72) Inventors: Oleg A. Mukhanov, Putnam Valley, NY (US); Igor V. Vernik, Yorktown Heights, NY (US)

(73) Assignee: SeeQC, Inc., Elmsford, NY (US)

( * ) Notice: Subject to any disclaimer, the term of this patent is extended or adjusted under 35 U.S.C. 154(b) by 15 days.

(21) Appl. No.: 17/718,264

(22) Filed: Apr. 11, 2022

(65) Prior Publication Data

US 2022/0236623 A1 Jul. 28, 2022

Related U.S. Application Data

(63) Continuation of application No. 16/940,208, filed on Jul. 27, 2020, now Pat. No. 11,300,853, which is a continuation of application No. 16/149,910, filed on Oct. 2, 2018, now Pat. No. 10,725,361.

(60) Provisional application No. 62/566,852, filed on Oct. 2, 2017.

(51) Int. Cl.
*H03M 1/00* (2006.01)
*G02F 7/00* (2006.01)
*H03M 1/12* (2006.01)

(52) U.S. Cl.
CPC ............... *G02F 7/00* (2013.01); *H03M 1/12* (2013.01)

(58) Field of Classification Search
CPC ............ H03M 1/12; H03M 1/22; H03M 1/00; H03M 1/121; H03M 1/1245; G02F 7/00; G02F 1/03; G02F 2001/212; G02F 1/225; G02F 1/11; G02F 1/01; G02F 1/065; G02F 1/0147; G02F 1/13318; G02F 2203/05; G01J 9/04; G01D 5/2073; G02B 27/28
USPC .................................. 341/137, 141, 142, 155
See application file for complete search history.

(56) References Cited

U.S. PATENT DOCUMENTS

| 5,198,815 A * | 3/1993 | Przybysz | H03M 3/438 341/143 |
| 6,771,201 B1 * | 8/2004 | Currie | H03M 1/12 341/137 |
| 7,038,604 B2 * | 5/2006 | Hirano | H03M 3/414 341/143 |

(Continued)

FOREIGN PATENT DOCUMENTS

WO WO-2014135749 A1 * 9/2014 ............... G01J 5/024

*Primary Examiner* — Linh V Nguyen
(74) *Attorney, Agent, or Firm* — Hoffberg & Associates; Steven M. Hoffberg

(57) ABSTRACT

A system and method to convert a wideband optical signal to a multi-bit digital electrical signal using a superconducting integrated circuit. In a preferred embodiment, the optical signal modulates the phase (i.e., adjusts the timing) of a sequence of single-flux-quantum voltage pulses. The optoelectronic modulator may comprise an optically tunable Josephson junction, superconducting inductor, or bolometric detector, with switching speeds approaching 100 ps or less. The optical signal may comprise a plurality of optical signals such as a wavelength-division multiplexed signal. The optical-to-digital converter may be applied to high-speed digital communication switches, broadband digital input/output for superconducting or quantum computing, and control/readout of detector arrays.

20 Claims, 13 Drawing Sheets

(56) References Cited

U.S. PATENT DOCUMENTS

| | | | | |
|---|---|---|---|---|
| 7,889,992 B1* | 2/2011 | DiVincenzo | .......... | H04L 9/0852 |
| | | | | 398/115 |
| 8,705,972 B2* | 4/2014 | McLaren | ........... | G02B 6/12007 |
| | | | | 398/139 |
| 8,953,950 B2* | 2/2015 | Nazarathy | ................. | G02F 7/00 |
| | | | | 398/213 |
| 9,590,740 B1* | 3/2017 | Pace | ...................... | H04B 10/00 |
| 9,735,776 B1* | 8/2017 | Abdo | ..................... | G06N 10/00 |
| 10,069,619 B1* | 9/2018 | Zanoni | ................. | H04L 7/0075 |
| 2009/0232510 A1* | 9/2009 | Gupta | ............... | H04L 27/2096 |
| | | | | 375/296 |
| 2013/0289668 A1* | 10/2013 | Nirenberg | .............. | G06V 10/20 |
| | | | | 607/88 |
| 2013/0315597 A1* | 11/2013 | Shaver | ................ | H04J 14/0227 |
| | | | | 398/79 |
| 2016/0198954 A1* | 7/2016 | Wang | ................... | A61B 5/0095 |
| | | | | 600/407 |
| 2017/0286858 A1* | 10/2017 | La Cour | ................ | G06F 7/523 |
| 2018/0102470 A1* | 4/2018 | Das | ..................... | H01L 23/5384 |

\* cited by examiner

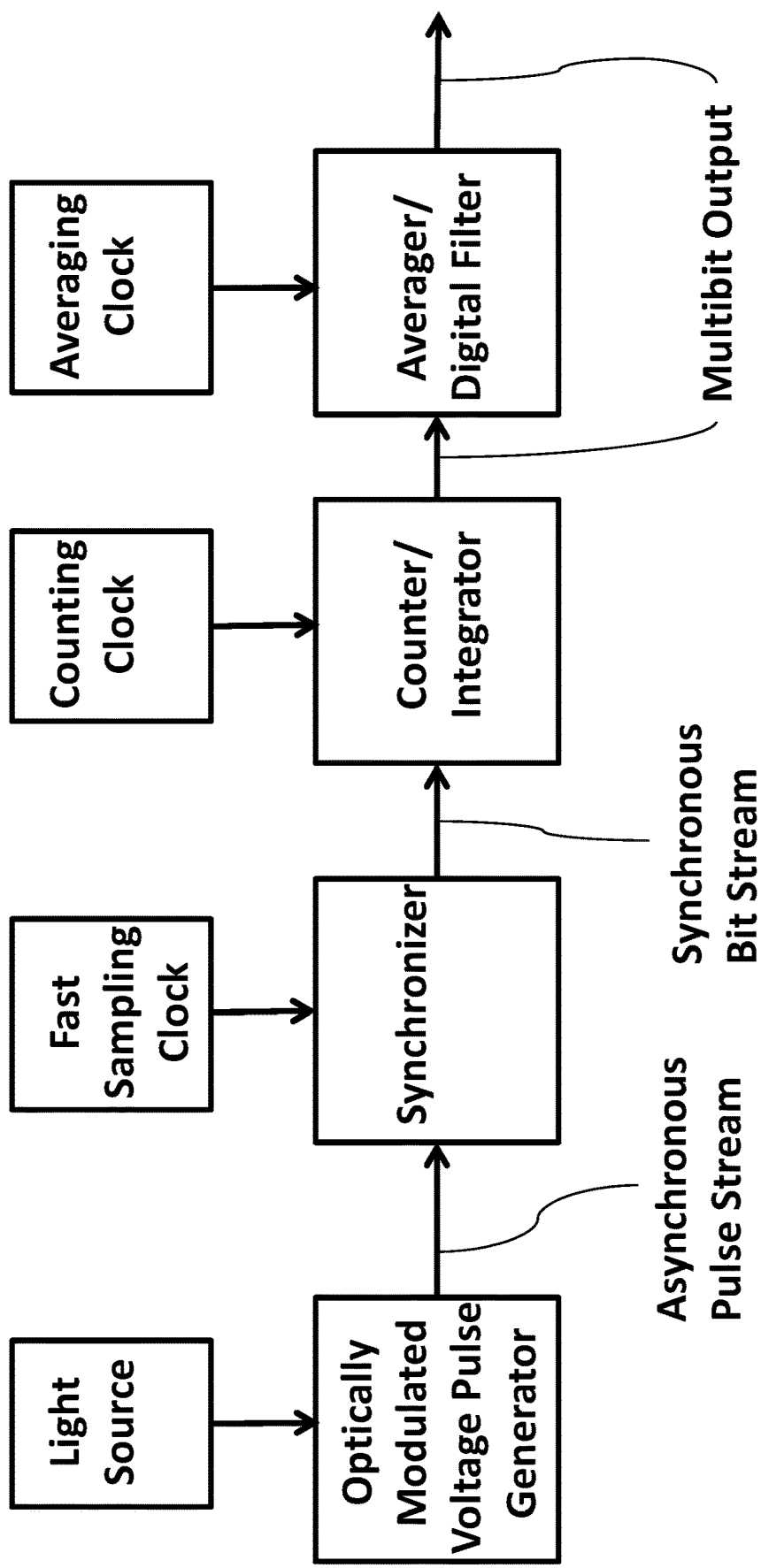

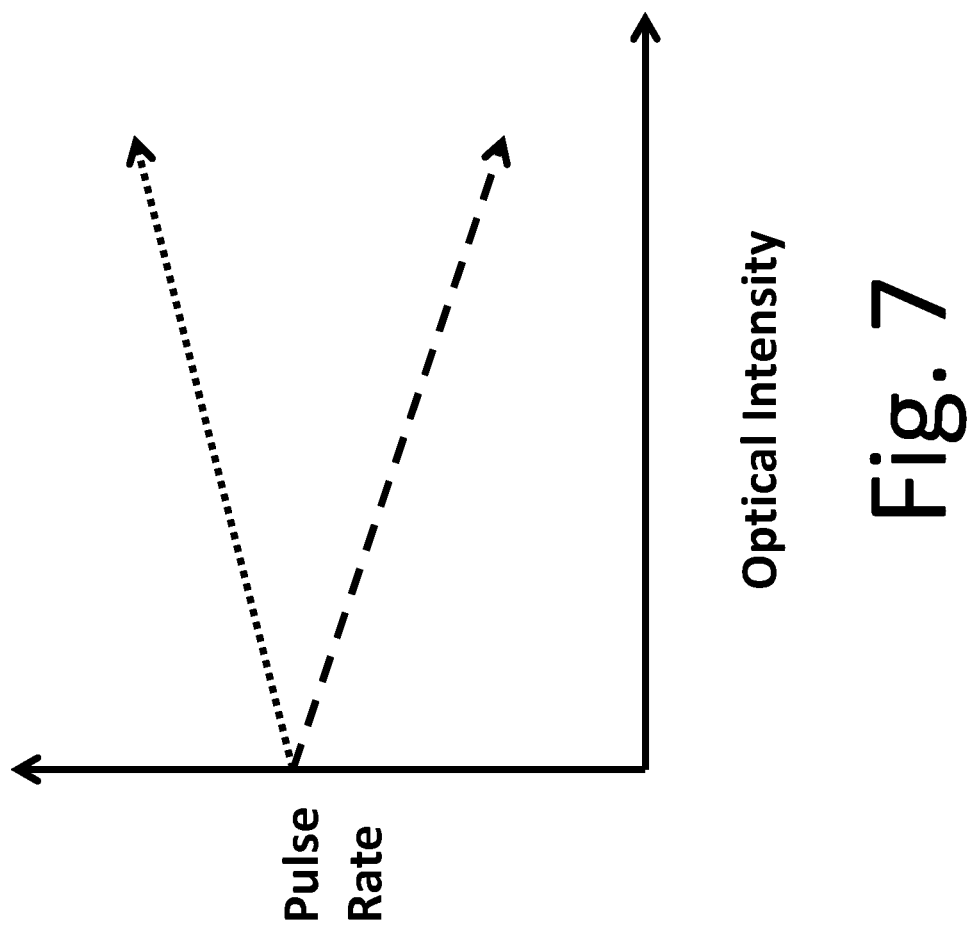

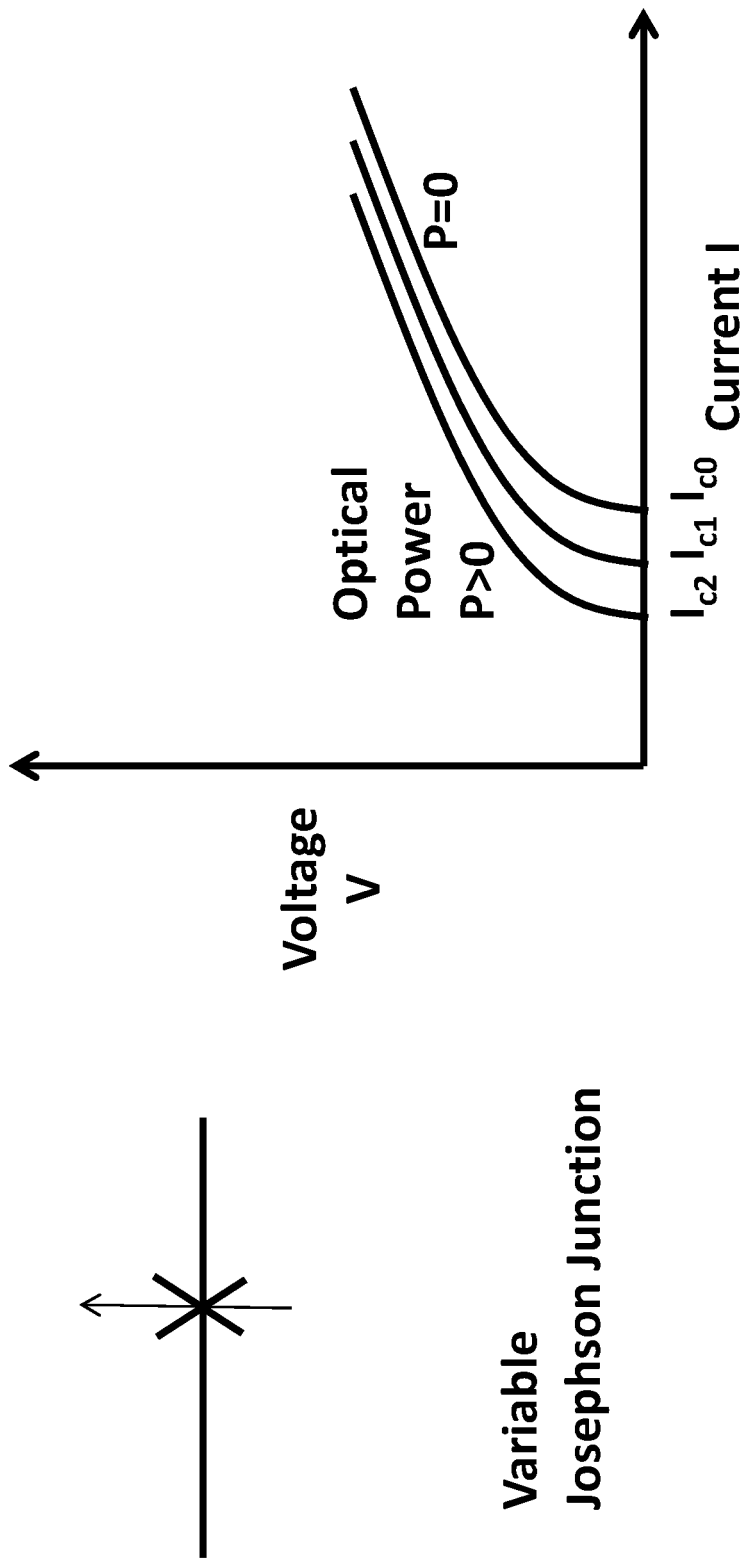

SUPERCONDUCTING OPTICAL-TO-DIGITAL CONVERTER

CROSS REFERENCE TO RELATED APPLICATIONS

The present application is a
Continuation of U.S. patent application Ser. No. 16/940,208, filed Jul. 27, 2020, now U.S. Pat. No. 11,300,853, issued Apr. 12, 2022, which is a
Continuation of U.S. patent application Ser. No. 16/149,910, filed Oct. 2, 2018, now U.S. Pat. No. 10,725,361, issued Jul. 28, 2020, which is a
Non-provisional of, and claims benefit of priority from, U.S. Provisional Patent Application No. 62/566,852, filed Oct. 2, 2018,
the entirety of which are expressly incorporated herein by reference.

FIELD OF THE INVENTION

The present invention relates to the field of analog to digital converters, and more particularly to analog optical signal digitizers.

BACKGROUND OF THE INVENTION

Each reference cited herein is expressly incorporated herein by reference in its entirety for all purposes.

Analog-to-Digital Converters, or ADCs, are essential components that convert data from analog sensors and receivers to the digital domain. Most commercial ADCs are based on semiconductor transistors and operate near room temperature. For certain applications, newer superconducting ADCs that operate at cryogenic temperatures near 4 K have been developed. See, for example, the following U.S. Pat. Nos. 3,983,419; 4,082,991; 4,393,357; 4,586,010; 4,694,276; 4,837,604; 4,904,882; 4,943,556; 4,956,642; 4,962,086; 4,977,402; 4,983,971; 4,990,462; 5,021,658; 5,064,809; 5,075,253; 5,171,732; 5,189,420; 5,198,815; 5,252,294; 5,345,114; 5,347,086; 5,347,143; 5,399,881; 5,400,026; 5,455,511; 5,536,947; 5,543,988; 5,550,389; 5,619,139; 5,629,838; 5,680,018; 5,687,112; 5,773,875; 5,780,314; 5,863,868; 5,869,958; 5,878,334; 5,892,243; 5,900,618; 5,912,503; 5,916,848; 5,939,730; 5,992,354; 6,000,225; 6,051,440; 6,066,600; 6,105,381; 6,115,233; 6,157,329; 6,166,317; 6,235,067; 6,284,586; 6,301,330; 6,313,587; 6,329,139; 6,331,805; 6,348,699; 6,365,912; 6,387,329; 6,439,253; 6,453,264; 6,486,756; 6,495,854; 6,509,853; 6,570,224; 6,608,518; 6,608,581; 6,610,367; 6,617,987; 6,649,929; 6,653,962; 6,710,343; 6,728,113; 6,759,010; 6,759,974; 6,771,201; 6,798,083; 6,916,719; 6,949,887; 6,962,823; 6,980,142; 7,019,391; 7,034,660; 7,038,604; 7,075,467; 7,084,691; 7,133,375; 7,144,553; 7,151,209; 7,180,074; 7,224,041; 7,233,144; 7,259,373; 7,272,431; 7,280,623; 7,289,197; 7,289,312; 7,330,369; 7,362,125; 7,365,663; 7,375,417; 7,395,166; 7,403,580; 7,436,910; 7,436,911; 7,436,912; 7,440,490; 7,471,224; 7,488,960; 7,489,537; 7,489,745; 7,495,242; 7,495,244; 7,495,245; 7,495,592; 7,496,158; 7,498,897; 7,501,644; 7,501,877; 7,507,960; 7,511,496; 7,535,005; 7,554,369; 7,560,932; 7,598,897; 7,630,227; 7,659,526; 7,659,981; 7,680,474; 7,687,409; 7,692,270; 7,701,220; 7,719,280; 7,719,392; 7,719,453; 7,728,748; 7,733,253; 7,864,560; 7,869,221; 7,869,974; 7,875,876; 7,876,869; 7,917,798; 7,928,875; 7,944,253; 7,956,640; 7,982,646; 7,986,218; 7,991,013; 7,993,813; 8,022,854; 8,031,510; 8,045,364; 8,045,660; 8,050,648; 8,055,235; 8,055,318; 8,073,631; 8,076,249; 8,078,130; 8,081,946; 8,084,762; 8,093,900; 8,130,880; 8,149,894; 8,159,825; 8,169,081; 8,179,133; 8,184,673; 8,188,901; 8,198,621; 8,217,381; 8,249,129; 8,249,540; 8,260,143; 8,260,144; 8,260,145; 8,274,817; 8,278,027; 8,301,104; 8,324,897; 8,390,100; 8,399,365; 8,401,050; 8,401,509; 8,401,600; 8,406,834; 8,416,109; 8,423,103; 8,423,297; 8,441,154; 8,450,716; 8,462,889; 8,466,583; 8,493,771; 8,509,354; 8,509,368; 8,514,986; 8,521,117; 8,565,345; 8,587,915; 8,593,141; 8,604,791; 8,618,799; 8,648,287; 8,653,497; 8,658,994; 8,664,767; 8,664,955; 8,698,570; 8,729,524; 8,736,452; 8,744,541; 8,754,396; 8,787,873; 8,804,358; 8,811,536; 8,867,931; 8,872,690; 8,895,913; 8,901,778; 8,901,779; 8,901,928; 8,904,809; 8,907,531; 8,912,687; 8,912,805; 8,922,066; 8,928,276; 8,933,520; 8,933,594; 8,933,695; 8,937,255; 8,946,938; 8,953,950; 8,957,549; 8,970,217; 8,977,223; 9,019,679; 9,020,079; 9,020,362; 9,036,319; 9,054,094; 9,065,423; 9,065,452; 9,077,412; 9,097,769; 9,105,555; 9,106,203; 9,110,249; 9,154,172; 9,165,979; 9,166,731; 9,213,085; 9,225,918; 9,252,825; 9,261,573; 9,276,615; 9,312,760; 9,312,878; 9,312,895; 9,324,733; 9,344,069; 9,367,288; 9,373,592; 9,392,957; 9,395,425; 9,400,127; 9,400,214; 9,401,240; 9,425,838; 9,442,066; 9,450,696; 9,453,814; 9,464,350; 9,509,315; 9,515,025; 9,520,180; 9,548,878; 9,554,303; 9,554,738; 9,565,385; 9,577,690; 9,588,191; 9,589,686; 9,602,168; 9,608,672; 9,614,532; 9,618,591; 9,647,194; 9,661,596; 9,693,694; 9,696,397; 9,698,607; 9,705,571; 9,742,429; 9,748,937; RE37259; RE44097; 20020060635; 20020154029; 20020177769; 20030076251; 20030179831; 20040022332; 20040120299; 20040195512; 20040217748; 20040217822; 20060017488; 20060145750; 20060170535; 20060197943; 20070055133; 20070075752; 20070077906; 20070081611; 20070098058; 20070194225; 20070223936; 20070293160; 20080048902; 20080049885; 20080101444; 20080101501; 20080101503; 20080107213; 20080186064; 20080252293; 20090073017; 20090140739; 20090153381; 20090168286; 20090232191; 20090232507; 20090232510; 20090265112; 20100026537; 20100026538; 20100057653; 20100066576; 20100149011; 20100259261; 20110054236; 20110109310; 20110210811; 20110288823; 20120062230; 20120062345; 20120082283; 20120112531; 20120112532; 20120112534; 20120112535; 20120112536; 20120112538; 20120112691; 20120119569; 20120119575; 20120119576; 20120119698; 20120123693; 20120157321; 20120166117; 20120184338; 20120198591; 20120213531; 20120223709; 20120228952; 20120228953; 20120228954; 20120235500; 20120235501; 20120235502; 20120235503; 20120235504; 20120235566; 20120235567; 20120235633; 20120235634; 20120239117; 20120242159; 20120242225; 20120244290; 20120248886; 20120248887; 20120248888; 20120248981; 20120256494; 20120274494; 20120328301; 20130004180; 20130036078; 20130253302; 20130272453; 20130315597; 20140013724; 20140027638; 20140097846; 20140113828; 20140166868; 20140199490; 20140233942; 20140266202; 20140285198; 20140286465; 20150061404; 20150069831; 20150078290; 20150125155; 20150137830; 20150143817; 20150219732; 20150229343; 20150236546; 20150255994; 20150333536; 20150338478; 20160028402; 20160028403; 20160033597; 20160087687; 20160091578; 20160097718; 20160161550; 20160197628; 20160245852; 20160267032; 20160283197; 20160292586; 20160292587; 20160324438; 20170026175; 20170134091; 20170163301; 20170176623; 20170179973; 20170244450; 20170244453; 20170244454; 20170244455; and 20170265158; See also Mukhanov, "Superconductor Analog-to-Digital Converters", Proceedings of the IEEE, vol. 92, p. 1564, 2004.

Superconducting ADCs typically use integrated circuits with many Josephson junctions, and are based on single-flux-quantum (SFQ) pulses. These fast pulses, typically 2 ps wide and 1 mV high, are naturally generated by a Josephson junction biased above the critical current $I_c$ (see FIG. 1), and are responsible for the high speed, low power, and sensitivity of these ADCs. Josephson junctions biased below $I_c$ can regenerate and transmit SFQ pulses, forming an active Josephson transmission line (JTL) that provides the basis of rapid-single-flux-quantum (RSFQ) digital logic (see FIG. 2). These ADCs typically have sampling rates in excess of 20 GHz, and can digitize rapidly varying radio signals with bandwidths in excess of 10 GHz. The ADCs can be integrated with RSFQ digital signal processing on the same chip. In general, superconducting ADCs offers the best combination of broad bandwidth, low power, and high sensitivity of any electronic technology.

One type of prior-art superconducting ADC is known as a phase-modulation-demodulation ADC (PMD). In this system, as shown in FIG. 3 (taken from Mukhanov 2004), an analog electrical input modulates a periodic pulse train of SFQ pulses, either advancing or retarding a given pulse. This asynchronous pulse train is subsequently synchronized, integrated, and averaged, in order to generate additional effective bits. The concept of a PMD ADC has also been embodied in other technologies. For example, Tanoni, U.S. Pat. No. 9,356,704, discloses an analog electrical signal modulating an optical pulse train, which is subsequently demodulated to generate electrical bits.

While radio waves are widely used for propagating broadband signals in free space, an alternative mode for long-distance communication is via light on optical fibers. The signals can propagate for long distances with little attenuation. Typical optical carriers are infrared light with wavelength 1.2-1.7 µm. See en.wikipedia.org/wiki/Fiber-optic_communication. Optical signals may also be used for imaging and for intra-computer and inter-computer communication.

In most cases, an electrical signal is modulated onto the optical carrier at the transmission end, and demodulated at the receiving end. A wide variety of technologies can be used for modulators and transducers that operate near room temperature, including electro-optic, magneto-optic, acousto-optic, photoelastic, and electro-absorptive effects. See, for example, www.rp-photonics.com/optical_modulators.html.

Because of the extremely high optical frequencies, many broadband multi-GHz signals can be carried on the same optical fiber, using a technology known as Wavelength-Dispersive Multiplexing (WDM). See, for example, en.wikipedia.org/wiki/Wavelength-division_multiplexing. In some cases, a set of integrated micro-ring waveguides can be used as add-drop multiplexers, to consolidate or split off the various component wavelengths. See for example, U.S. Pat. Nos. 7,539,418; 8,805,130; 2015/0168748; also Q. Xu, et al., "Cascaded silicon micro-ring modulators for WDM optical interconnection", Optics Express, vol. 14, p. 9431, 2006, from which FIG. 4 was copied.

There have been several approaches in the prior art to digitizing such optical signals. One approach is to demodulate the optical signal to generate a radio-frequency electrical signal, and then use an electrical ADC to generate a digital representation. However, a system that integrates these functions together should be more efficient and compact. U.S. Pat. No. 5,850,195 provides a monolithic light-to-digital signal converter. Other patents for broadband optical digitizers include U.S. Pat. Nos. 6,265,999; 7,564,387; 8,514,115; 8,725,004; 8,730,562.

These optical ADCs should be distinguished from optically-enhanced electrical ADCs, where the input and output signals are electronic, but optical elements are used in part of the sampling or quantizing. Low-jitter optical clocks may be used, or precision optical delay lines. For example, U.S. Pat. No. 6,771,201, Hybrid Photonic Analog-to-Digital Converter, discloses a system whereby a train of optical pulses are used to generate a train of fast electrical pulses using superconducting devices, which are then used as a sampling clock for a superconducting ADC. But the signal to be quantized is an electrical signal, not an optical signal. Other optically-enhanced electrical ADCs (which have sometimes been labeled "photonic ADCs") are disclosed in the following U.S. Pat. Nos. 7,876,246; 6,100,831; 6,661,361; and 6,700,517. See also: U.S. Pat. Nos. 3,999,063; 4,078,232; 4,209,853; 4,294,127; 4,320,484; 4,502,037; 4,712,089; 4,770,483; 4,851,840; 4,926,177; 4,928,007; 5,097,473; 5,101,270; 5,264,849; 5,267,139; 5,381,147; 5,403,040; 5,552,881; 5,583,950; 5,627,920; 5,636,050; 5,892,151; 5,982,932; 6,064,507; 6,118,397; 6,175,320; 6,188,342; 6,326,910; 6,404,365; 6,404,366; 6,420,984; 6,420,985; 6,434,173; 6,469,649; 6,469,817; 6,525,682; 6,529,150; 6,636,681; 6,671,298; 6,686,997; 6,713,224; 6,714,149; 6,754,631; 6,771,201; 6,784,466; 6,873,468; 6,956,653; 7,016,421; 7,050,182; 7,083,998; 7,124,036; 7,194,139; 7,212,140; 7,233,261; 7,245,795; 7,294,446; 7,327,913; 7,350,939; 7,362,931; 7,397,979; 7,400,703; 7,420,505; 7,483,600; 7,564,387; 7,570,184; 7,715,720; 7,787,767; 7,801,395; 7,858,949; 7,940,201; 7,956,788; 7,967,764; 7,990,299; 8,026,837; 8,126,298; 8,263,928; 8,269,658; 8,334,797; 8,384,978; 8,432,153; 8,442,402; 8,446,305; 8,456,336; 8,466,819; 8,514,115; 8,548,331; 8,593,716; 8,618,966; 8,655,176; 8,686,712; 8,692,774; 8,725,004; 8,779,955; 8,836,703; 8,886,726; 8,902,095; 8,902,096; 8,928,510; 8,953,950; 8,954,554; 8,963,751; 8,965,211; 9,001,619; 9,045,970; 9,176,361; 9,197,471; 9,201,287; 9,329,413; 9,341,921; 9,350,458; 9,389,326; 9,395,456; 9,413,372; 9,438,263; 9,442,205; 9,450,597; 9,450,696; 9,467,223; 9,502,856; 9,557,433; 9,571,731; 9,612,304; 9,645,377; 9,647,827; 9,716,553; 9,734,285; 9,746,743; 9,772,414; RE28954; RE35766; 20020067299; 20020163454; 20040001016; 20040096143; 20060072186; 20070110362; 20070140613; 20070274733; 20080088502; 20090142051; 20100002281; 20100201345; 20100277354; 20110002029; 20110182587; 20110234435; 20120212360; 20120213531; 20130062508; 20130315597; 20130328706; 20140067300; 20150323852; and 20160087716.

A number of fast optical detectors and modulators have been developed for cryogenic environments, including both semiconducting and superconducting photosensitive elements. Semiconductor devices include a metal-semiconductor-metal (MSM) diode, and low-temperature-deposited GaAs, and generally function by increasing the density of charge carriers. Other novel materials such as graphene may also be used at cryogenic temperatures. See, for example, Phare, "Graphene electro-optic modulator with 30 GHz bandwidth", Nature Photonics, vol. 9, p. 511 (2015).

Superconducting optical detectors include Josephson junctions, ultrathin niobium nitride films (NbN), superconducting tunnel junctions, and transition-edge sensors. The superconducting devices can be configured to be quite sensitive to weak optical intensities, with output signals that are well matched to superconducting readout circuits. Detection mechanism may include nonequilibrium heating of the superconductor (see Ilin, "Picosecond hot-electron relaxation in NbN superconducting photodetectors", Applied Physics Letters, vol. 76, p. 2752, 2000), or altering the conductance of a Josephson junction or tunnel barrier (see Andreozzi, "Tunneling characteristics of Pb-CdS-Pb light-sensitive Josephson Junctions," IEEE Trans. on Appl. Supercond., vol. 19(3), p. 983, 1983). The critical current of an element may change, or its kinetic inductance, or its resistance, in a transient manner that recovers quickly, on the 100 ps timescale or faster. Sensors may be sensitive to the signal of a single photon, particularly for photons in the infrared or visible range. Detectors may also provide spectral information, i.e., determine the energy of a single photon. See, for example, the following U.S. Pat. Nos. 6,812,464; 9,500,519; 2014/0353476; 6,815,708; 5,039,951; 5,057,485; 5,880,468; 6,239,431; 8,761,848; 9,577,176; 9,523,777; see also JP 5,158,920.

There have been several systems for using optical pulses to generate SFQ pulses. See, for example, Kaplounenko, U.S. Pat. No. 5,963,351, "Digital Optical Receiver with Instantaneous Clock Recovery Circuit", issued 1999; Sobolewski, "Ultrafast optoelectronic interface for digital superconducting electronics", Superconductor Science and Technology, vol. 14, pp. 994-1000 (2001); Shinada et al., "1550 nm band optical input module with superconducting SFQ circuit", Applied Physics Letters, vol. 96, 182504 (2010). In these systems, the optical intensity is not measured, but the detector serves just as an on-off switch.

Another type of readout scheme for a superconducting sensor that provides intensity information is to couple it to a superconducting resonator. If the optical signal causes an inductance, capacitance, or resistance of such a resonator to change, this will alter the spectral response of the resonator. Alternatively, a superconducting quantum interference device or SQUID has also been used in the prior art as an output device, generally as a low-noise analog amplifier. While a SQUID may also be used as a fast digital device, this mode has not been reported in connection with optical sensors. See Chevernak, "Superconducting multiplexer for arrays of transition-edge sensors", Applied Physics Letters, vol. 74, p. 4043 (1999); Mazin, "Digital readouts for large microwave low-temperature detector arrays", Nuclear Instruments and Methods in Physics A, vol. 559, p. 799 (2006). While these systems disclose conversion to digital signals, this is implemented in a separate digital processing system not integrated with the detection. See, Mazin, B. A., Day, P. K., Leduc, H. G., Vayonakis, A. & Zmuidzinas, J. Superconducting kinetic inductance photon detectors. Proc. SPIE 4849, 283-293 (2002). citeseerx.ist.psu.edu/viewdoc/download?doi=10.1.1.562.6076&rep=rep1&type=pdf Thus, there have been no reported multi-bit digital integrated readout schemes of fast superconducting optical sensors on the multi-GHz timescale.

There have also been efforts to provide a modulated optical output from digital superconducting devices (digital-to-optical conversion), but this has been very difficult to implement due to the severe mismatch in voltage and energy levels, so these have not been reduced to practice. Several US patents that address this include the following: U.S. Pat. Nos. 6,661,560; 6,476,956; 5,886,809; 5,566,015; 5,110,792; 2002/0105948. Unpublished application Ser. No. 15/356,030 also addresses this issue. Superconducting digital-to-optical conversion is not a subject of the present invention.

As noted in U.S. 2016/0292587 (Rigetti, et al.), supra, incorporated herein by reference:

The quantum computing system may include a control system, a signal delivery system, and a quantum processor cell. The quantum computing system can perform quantum computational tasks and algorithms. In some implementations, the quantum computing system can perform quantum computation by storing and manipulating information within individual quantum states of a composite quantum system. For example, qubits (i.e., quantum bits) can be stored in and represented by an effective two-level sub-manifold of a quantum coherent physical system. The formation of composite systems for quantum computing can be achieved by couplings between the individual physical qubits, for example, to perform conditional quantum logic operations. In some instances, the couplings between physical qubits can be rendered in a manner that allows large-scale entanglement within the quantum computing device. Control signals can manipulate the quantum states of individual qubits and the couplings between qubits. In some instances, information can be read out from the composite quantum system by measuring the quantum states of the individual qubits.

The quantum computing system can be constructed and operated according to a scalable quantum computing architecture. For example, in some cases, the architecture can be scaled to a large number of qubits to achieve large-scale general purpose coherent quantum computing. In some instances, the architecture is adaptable and can incorporate a variety of modes for each technical component. For example, the architecture can be adapted to incorporate different types of qubit devices, coupler devices, readout devices, signaling devices, etc. In some cases, the architecture of the quantum computing system provides a practicable and economical solution for large-scale quantum computation.

The qubits can each store a single bit of quantum information, and the qubits can collectively define the computational state of a quantum processor or quantum memory. The quantum processor cell may also include readout devices that selectively interact with the qubits to detect their quantum states. For example, the readout devices may generate readout signals that indicate the computational state of the quantum processor or quantum memory. The quantum processor cell may also include couplers that selectively operate on pairs of qubits and allow quantum interactions between the qubits. For example, the couplers may produce entanglement or other multi-qubit states over two or more qubits in the quantum processor cell.

The quantum processor cell can process the quantum information stored in the qubits by applying control signals to the qubits or to the couplers housed in the quantum processor cell. The control signals can be configured to encode information in the qubits, to process the information by performing logical gates or other types of operations, or to extract information from the qubits. The operations can be expressed as single-qubit gates, two-qubit gates, or other types of logical gates that operate on one or more qubits. A sequence of operations can be applied to the qubits to perform a quantum algorithm.

The quantum algorithm may correspond to a computational task, a quantum error correction procedure, a quantum state distillation procedure, or a combination of these and other types of operations. The quantum processor cell 102 may output information indicating the states of the qubits, for example, by applying control signals to the readout devices.

The signal delivery system provides communication between the control system and the quantum processor cell. For example, the signal delivery system can receive control signals (e.g., qubit control signals, readout control signals, coupler control signals, etc.) from the control system and deliver the control signals to the quantum processor cell. In some instances, the signal delivery system performs preprocessing, signal conditioning, or other operations to the control signals before delivering them to the quantum processor cell. In some instances, the signal delivery system receives qubit readout signals from the quantum processor cell and delivers the qubit readout signals to the control system. In some instances, the signal delivery system performs preprocessing, signal conditioning or other operations on the readout signals before delivering them to the control system.

The control system controls operation of the quantum processor cell. The control system may include data processors, signal generators, interface components and other types of systems or subsystems. In some cases, the control system includes one or more classical computers or classical computing components.

The control system interfaces with the signal delivery system through control system connector hardware; and the signal delivery system interfaces with the quantum processor cell through QPC input connector hardware and QPC output connector hardware. The connector hardware elements can include signal lines, processing components, feedthrough devices, or a combination of these and other types of components.

The signal delivery system and the quantum processor cell are maintained in a QPC environment. The QPC environment can be provided, for example, by shielding equipment, cryogenic equipment, and other types of environmental control systems. The components in the environment operate in a cryogenic temperature regime and are subject to very low electromagnetic and thermal noise. For example, magnetic shielding can be used to shield the system components from stray magnetic fields, optical shielding can be used to shield the system components from optical noise, thermal shielding and cryogenic equipment can be used to maintain the system components at controlled temperature, etc. The levels and types of noise that are tolerated or controlled in the QPC environment can vary, for example, based on the features and operational requirements of the quantum processor cell and the signal delivery system.

The control system can include a signal generator system, a program interface and a signal processor system. A control system may include additional or different components. Components of the control system operate in a room temperature regime, an intermediate temperature regime, or both. For example, the control system can be configured to operate at much higher temperatures and be subject to much higher levels of noise than are present in the QPC environment. The control system connector hardware can be configured to isolate the components in the QPC environment from noise in the environment of the control system.

The signal generator system generates control signals from control information provided by the program interface. The signal generator system may include a microwave signal generator, a DC control source, or other types of components that generate control signals. The control signals can be delivered to the quantum processor cell by the signal delivery system.

The program interface can include a classical computing cluster, servers, databases, networks, or other types of classical computing equipment. In some instances, the program interface includes one or more microprocessors running software, monitors or other display apparatus, interface devices, and other types of classical computing components. The program interface can generate control information, for example, based on a quantum task or a quantum algorithm to be performed by the quantum computing system, based on qubit readout information, or based on a combination of these and other types of information.

The signal processor system can receive and process qubit readout signals from the quantum processor cell. For example, the signal processor system can include a digitizer, a microwave source, and other types of signal processing components. The qubit readout signals can be delivered to the signal processor system by the signal delivery system. The signal processor system can process (e.g., digitize, or otherwise process) the qubit readout signals and provide the processed information to the program interface. The program interface can extract qubit readout data, for example, to identify the quantum states of qubits in the quantum processor cell.

The signal delivery system shown includes an input signal processing system and an output signal processing system. The signal generator system communicates signals to the input signal processing system through the control system connector hardware; and the output signal processing system communicates signals to the signal processor system through the control system connector hardware.

The control system connector hardware can include signal lines, signal processing hardware, filters, feedthrough devices, and other types of components. In some implementations, the control system connector hardware 126 can span multiple different temperature and noise regimes. For example, the control system connector hardware can include a series of temperature stages (60 K, 3 K, 800 mK, 150 mK) that decrease between the higher temperature regime of the control system and the lower temperature regime of the QPC environment.

The qubit devices can each be used to encode and store a single bit of quantum information. Each of the qubit devices has two eigenstates used as computational basis states ("0" and "1"), and each qubit device can transition between its computational basis states or exist in an arbitrary superposition of its basis states. The quantum state of the qubit devices can be manipulated by qubit control signals provided by the signal delivery system.

Each qubit device may have a fixed qubit operating frequency that is defined by an electronic circuit of the qubit device. For instance, a qubit device (e.g., a transmon qubit) may be implemented without a superconducting SQUID loop. In some examples, the operating frequency of a qubit device is tunable, for example, by application of an offset field. For instance, a qubit device (e.g., a fluxonium qubit) may include a superconducting SQUID loop that is tunable by application of magnetic flux. A qubit device can be driven at its qubit operating frequency (or in some cases, at another frequency) to manipulate the quantum state of the qubit. For example, a single-qubit gate can be applied to a qubit by applying a pulse that is configured to perform the single-qubit gate.

The readout devices can be used to probe the quantum states of the qubit devices. The readout devices can be operatively coupled to individual qubit devices. In some examples, each readout device is capacitively coupled to exactly one qubit device. The readout device can be housed on a common chip or in a common structure with the associated qubit device, or the readout device can be formed on a separate chip or in a separate structure from the qubit device.

Each readout device may have a resonance that depends on the quantum state of its associated qubit device. For example, the resonance frequency of a particular readout device can indicate the quantum state of the associated qubit device. The readout device can be probed by a readout control signal, and the readout device can produce a qubit readout signal in response to the readout control signal. The properties of the qubit readout signal can indicate one of the two computational basis states of the associated qubit device. For instance, the readout device can produce a qubit readout signal by reflecting the readout control signal with additional information. The additional information can be, for example, a frequency shift, a phase shift, an amplitude shift, or a combination of these and other modifications, that indicates the state of the associated qubit device.

Solid state qubit devices can be realized from individual atoms or ions, individual electron or nuclear spins, charge- or spin-based quantum dots, superconducting quantum circuits based on Josephson junctions, impurities and defects in diamond or silicon carbide, or other types of systems. Superconducting qubits with Josephson junctions can be embedded within a resonator for shielding and isolation and to provide a linear resonant mode coupled to the qubit for purposes of qubit readout. The resonator may be formed from a two-dimensional transmission line segment, for example, a coplanar waveguide geometry, or a microstrip geometry. The resonator may be formed as a lumped or quasi-lumped element resonator, or the resonator may be realized as a rectangular waveguide cavity, formed of a shorted (closed on both ends) section of a waveguide transmission line.

A coupler device may include a superconducting quantum interference device (SQUID) loop whose resonance frequency determines the coupling strength of the electromagnetic interaction between the neighboring pair of qubit devices. For instance, the coupling strength may be increased by setting the resonance frequency of the SQUID loop in a frequency range near the resonance frequency of either qubit device. In such examples, the resonance frequency of the SQUID loop can be tuned by controlling the amount of magnetic flux experienced by the SQUID loop. Thus, manipulating the magnetic flux can increase or decrease the resonance frequency of the SQUID loop, which in turn influences the coupling strength provided by the coupler device. In this example, the magnetic flux through the SQUID loop is an offset field that can be modified in order to tune the coupler resonance frequency. For instance, the coupler device can include an inductor that is coupled to the SQUID loop by a mutual inductance. Thus, the magnetic flux through the SQUID loop can be controlled by the DC component of the current through the inductor. In some cases, the coupling strength is controlled by both AC and DC components of the coupler control signal.

Coupler devices that are tunable by application of an offset field may be used with qubit devices that do not respond to offset fields. This may allow the coupler devices to be selectively activated by an offset field that does not disturb the information encoded in the qubit device. For instance, although the offset field may cause the coupler device to produce an electromagnetic interaction between neighboring qubit devices, the offset field does not directly interact with the qubit device or disturb the quantum state of the qubit device even if the qubit device experiences the offset field. Thus, the combination of tunable couplers with fixed-frequency qubit devices may allow selective, on-demand coupling of qubit devices while improving performance of the qubit devices. For example, the fixed-frequency qubit devices may have longer coherence times, may be more robust against environmental or applied offset fields, etc.

Information may be encoded in the qubit devices, and the information can be processed by operation of the qubit devices and the coupler devices. For instance, input information can be encoded in the computational states or computational subspaces defined by some of all of the qubit devices. The information can be processed, for example, by applying a quantum algorithm or other operations to the input information. The quantum algorithm may be decomposed as gates or instruction sets that are performed by the qubit devices and coupler devices over a series of clock cycles. For instance, a quantum algorithm may be executed by a combination of single-qubit gates and two-qubit gates. In some cases, information is processed in another manner. Processing the information encoded in the qubit devices produces output information that can be extracted from the qubit devices. The output information can be extracted, for example, by performing state tomography or individual readout operations. In some instances, the output information is extracted over multiple clock cycles or in parallel with the processing operations.

The quantum computing system may operate based on a clock cycle or another type of synchronization scheme. For example, a quantum algorithm or quantum computing task may be expressed as a sequence of instructions corresponding to quantum gates, readouts, or other operations on the qubit devices, and a subset of the instructions can be executed on each clock cycle. On each clock cycle, the control system generates control signals to implement a subset of instructions, control signals are delivered to the quantum processor cell, and qubit readout signals are delivered to the control system. The control signals delivered on each clock cycle can be configured, for example, based on the sequence of instructions, based on readout signals from a previous cycle, quantum error correction operations, error matching calculations, other information, or a combination of these.

A fluxonium device includes a Josephson junction, a shunt inductance and a shunt capacitance connected in a loop to which a magnetic flux signal can be applied. The magnetic flux signal can be applied to the loop, for example, by applying a DC signal to bias circuitry that has a mutual inductance with the loop. The input capacitance across the Josephson junction can provide a charge-coupling control port. The charge-coupling control port may be formed of a topologically closed capacitance, for instance, where the inner island is encircled by the outer island. In some implementations, a control or coupling port can be realized by coupling the device with a differential capacitance with respect to these two islands to a nearby electrode.

Signals can be communicated between the components operating in the different temperature stages of the quantum computing system. In some cases, analog control signals are communicated in the room temperature environment on coaxial cables, waveguides, high-density microwave wires, or other types of transmission lines, and the analog control signals can be transferred between the room temperature environment and the intermediate temperature environments using feedthrough devices that allow signals to pass through but provide isolation for spurious electromagnetic noise outside of the signal band. In some cases, analog control signals are communicated in the cryogenic temperature environment on superconducting high-density microwave wires, co-axial or co-planar waveguide structures, or other types of transmission lines, and analog control signals can be transferred between the cryogenic temperature environment and the intermediate temperature environments using feedthrough devices.

The example quantum computing system includes multiple operating domains. Each of the operating domains can include dedicated hardware at one or more stages of the quantum computing system. The operating domains can be controlled collectively and may share hardware at one of more stages of the quantum computing system. The quantum processor can include an array of qubit devices, and each operating domain includes a particular group of the qubit devices and the associated devices and other hardware that operate in connection with the particular group of qubit devices. The devices in each group have distinct operating frequencies. A device in one group can have the same operating frequency as a device and another group, since the groups operate within different operating domains.

The qubit operating frequencies for an operating domain are interleaved with the readout frequencies for the same operating domain. In some example interleaved schemes, each qubit device and its corresponding readout device operate within a frequency band, and the frequency band for each qubit and readout device pair is separate and distinct (non-overlapping) with the frequency band for the other qubit and readout device pairs within the same operating domain. Each operating domain in a quantum computing system can have the same allocation of frequency bands for the qubit and readout device pairs, or the various operating domains can have distinct frequency band allocations.

The qubit operating frequencies for an operating domain are not interleaved with the readout frequencies for the same operating domain. For example, the qubit devices within an operating domain can have respective qubit operating frequencies in a first frequency band, and the readout devices in the operating domain can have respective readout frequencies in a second, separate frequency band. In such cases, the qubit operating frequencies fall within one sub-band of the frequency spectrum, and the readout frequencies fall within a different sub-band of the frequency spectrum. In some example non-interleaved schemes, the qubit frequency band (the frequency band that contains the qubit operating frequencies) for a group of qubit devices within an operating domain is separate and distinct (non-overlapping) from the readout frequency band (the frequency band that contains the readout frequencies) for the group of readout devices in the same operating domain. The readout frequency band can be higher or lower than the qubit frequency band. Each operating domain can have the same allocation of operating frequencies, qubit frequency bands and readout frequency bands, or the various operating domains can have distinct frequency bands and operating frequency allocations.

The control system components that operate in the room temperature stage may include a signal generator system, a signal processor system, and a control interface. Additional or different components may operate in the room temperature stage. The example signal generator system includes a microwave signal generator, and may include additional or different components.

The microwave signal generator can generate analog control signals based on digital control information received from the control interface. For example, the control interface may provide a digital multiplexed control signal for a group of devices in the quantum processor cell, and the microwave signal generator can generate an analog multiplexed control signal that corresponds to the digital multiplexed control signal. Each analog multiplexed control signal can be communicated into the cryogenic environment on a single physical channel in some instances.

The example signal processor system includes a digitizer, a mixer and a microwave source for each operating domain. The signal processor system can receive qubit readout signals and convert the qubit readout signals to qubit readout information that can be used to determine the quantum states of the qubit devices. For example, the qubit readout signals can be analog qubit readout signals from the signal delivery system, and the signal processor system can convert the analog qubit readout signals to digital qubit readout information. The qubit readout information can be delivered to the control interface where the information can be processed, for example, by a classical processor running software or dedicated classical processing hardware.

In some cases, the qubit readout signals received by the signal processor system are multiplexed signals that include readout signals from multiple readout devices. For instance, each multiplexed readout signal can include readout signals from multiple devices in an operating domain. The control interface can digitally de-multiplex the readout signals after they have been digitized by the signal processor system, or the signal processor system may extract qubit readout information directly from the digitized readout output pulses and send digital data to the control interface, for instance.

The quantum computing system includes a multichannel signal amplifier and a multichannel isolator in the intermediate temperature stages. quantum computing system may include additional or different features and components operating in one or more intermediate temperature stages. The multichannel signal amplifier can amplify or otherwise modulate signals that are communicated between the room temperature environment and the cryogenic environment. The multichannel isolator can isolate the signal lines between the cryogenic environment and the multichannel signal amplifier. The multichannel isolator can be a four-channel isolator that isolates a signal line for each operating domain.

In the cryogenic temperature stage, the example quantum computing system includes an input board, an input interconnect system, a quantum processor cell (QPC) assembly, an output interconnect system and an output board. The example quantum computing system can include additional or different features and components in the cryogenic temperature stage, and the components can be arranged or configured in the manner shown or in another manner.

The components operating in the cryogenic temperature stage receive input signals through the input board, and send out signals through the output board. Input control signals can be communicated to the input board on a distinct channel for each operating domain. Four distinct input channels each receive AC control signals for one of the operating domains. Similarly, output control signals can be communicated from the output board on a distinct channel for each operating domain. Each of the channels carries AC readout signals for one of the operating domains. The input board may include additional input channels to receive DC control signals (e.g., from the signal generator system). For example, the input board may receive one or more DC control signals for each coupler device.

The example input board includes an input processing subsystem. The input processing subsystem can include multiple input processing domains; for example, a dedicated input processing domain can process input signals for each operating domain of the quantum computing system. The input processing subsystem includes four input processing domains, and each input processing domain receives and processes control signals for the devices (qubit devices, coupler devices, readout devices) within one of the operating domains.

Each input processing domain of the input processing subsystem includes a diplexer, a de-multiplexer, a DC bias component and a de-multiplexer. The input processing subsystem may include additional or different components. The diplexer can separate input signals onto two distinct output channels based on the frequencies of the input signals. For example, the diplexer can separate low-frequency control signals from high-frequency control signals. In some examples, the drive signals for the coupler devices are all within a lower frequency band than the control signals for the qubit and readout devices. For example, the qubit operating frequencies are in the range of 3.2 to 3.9 GHz, and the drive frequencies for the coupler devices are in the range of 0.1 GHz to 0.7 GHz. Thus, the diplexer can receive input signals ranging from a few MHz to high microwave frequencies, and send lower frequency signals to a first device and send higher frequency signals to a second device. The diplexer sends low-frequency signals (e.g., 225 MHz through 1.375 GHz, or another frequency range) to the first de-multiplexer, and the diplexer sends high-frequency signals (e.g., above 2.5 GHz, or another threshold frequency) to the second de-multiplexer.

Each of the de-multiplexers separates input signals onto multiple distinct output channels based on the frequencies of the input signals. For example, each de-multiplexer can receive an input signal that includes multiple frequency components, and separate the distinct frequency components onto distinct output channels.

The de-multiplexer receives the qubit control signals and the readout control signals, which are microwave-frequency signals addressed to the respective qubit devices and readout devices. The qubit control signals and the readout control signals for a group of qubit devices and readout devices are delivered on a single input channel to the de-multiplexer, and the de-multiplexer separates the control signal for each individual qubit device onto the distinct physical output channels. The de-multiplexer is a 1:4 de-multiplexer that receives the high-frequency band output from the diplexer (e.g., 3 GHz to 4 GHz, or another frequency range).

The de-multiplexer receives the AC components of the coupler control signals, which are radio-frequency or microwave-frequency drive signals addressed to the respective coupler devices. In some instances, the drive signals for a group coupler devices are delivered on a single input channel to the de-multiplexer, and the de-multiplexer separates the drive signal for each individual coupler device onto a distinct physical output channel. The de-multiplexer is a 1:6 de-multiplexer that receives the low-frequency band output from the diplexer (e.g., 225 MHz through 1.375 GHz, or another frequency range).

In some instances, the quantum computing system can perform quantum computational tasks, execute quantum computing algorithms, perform quantum error correction, quantum state distillation, or perform other types of processes. For instance, the control interface can include a quantum compiler and a master clock, and can operate the quantum computing system on clock cycles, where a set of instructions are executed by the quantum computing system on each clock cycle. For example, the control interface can generate control information for each clock cycle according to a set of instructions from a quantum compiler; the signal generator system can receive the control information from the control interface and generate control signals that are delivered to the input board. The control interface may also receive qubit readout data on each clock cycle. For example, the signal processor system can receive readout signals from the output board and generate digital readout data that is delivered to the control interface.

Because the signal generator system operates in the room temperature stage, the multiplexed control signals are generated in a room temperature environment. The multiplexed control signals are communicated into the cryogenic temperature stage through the intermediate temperature stage. In some cases, the multiplexed control signals are microwave control signals that are communicated by a microwave waveguide or another type of transmission line. The multiplexed control signals are amplified by the multichannel signal amplifier in the intermediate temperature stage before they are communicated into the cryogenic temperature stage.

A read/write channel controller may include a field-programmable gate array (FPGA), an analog-to-digital converter (ADC) and a digital-to-analog converter (DAC). In some implementations, the channel controller can be a wideband frequency-agile signal generator such as an arbitrary waveform generator. The FPGA can control the DAC to produce a pulse or other signal having one or more frequency components targeted to one or more qubit devices or readout devices. For example, the signal can be addressed to an individual qubit device by generating the signal at a frequency that corresponds to the qubit operating frequency of the qubit device. As another example, the signal can be addressed to an individual readout device by generating a signal at a frequency that corresponds to the readout frequency of the readout device. The ADC can digitize the multiplexed readout signals and deliver them to the FPGA.

The signals generated by the channel controller can be multiplexed in time or in frequency, and they may be separated onto physically disparate signal paths. For example, the signals may be separated onto distinct channels through power division followed by passive frequency selective filtering, or by the use of a fast solid state microwave switch, switched in synchronicity with the time-multiplexing of the signal, to dynamically separate the outgoing signals.

The qubit readout signals from the readout devices and the multiplexed readout signal from the multiplexer are analog signals. The multiplexed readout signal is delivered to the wideband ADC, which digitizes the multiplexed readout signal. The digital multiplexed readout signal produced by the wideband ADC can be processed, for example, by a classical computer system. Because each qubit readout signal has a distinct readout frequency, the qubit readout data for each qubit device can be separated out of the digital multiplexed readout signal, for example, by digitally de-multiplexing the signal produced by the wideband ADC. Thus, The digital qubit readout data for each qubit device corresponds to the analog qubit readout signal from the qubit device. The qubit readout data can be used, for example, to identify the quantum states of the qubit devices, to generate quantum processor control information, or for a combination of these and other purposes.

The process can provide advantages for operating a quantum computing system. For example, electrical isolation between devices in the quantum processor cell can be maintained by distinct output signal lines for each device in the quantum processor cell. As another example, frequency multiplexing may reduce the frequency bandwidth allowed through each signal path from the quantum processor cell, which may reduce noise. In addition, the frequency filtering characteristics may reject out-of-band frequency content, which may provide isolation between devices operating in distinct frequency bands. Moreover, signal multiplexing can reduce the number of signal lines needed to carry signals across temperature stages, which may reduce cooling power requirements while also facilitating electrical isolation and noise reduction.

The quantum computing system can be assembled and deployed in an appropriate operating environment. For superconducting systems, the operating environment can include a cryogenic, low-noise environment where the ambient level of background noise is reduced or minimized at frequencies relevant to operation of the quantum processor cell. For example, a quantum processor cell with qubit devices and readout devices operating in the range of 3 GHz to 8 GHz maybe be deployed in an environment between 5 mK and 10 mK. In some cases, a quantum processor cell can be deployed at other temperatures (higher or lower). The temperature range can be guided, for example, by the formula $f=k_B T/h$, where f indicates the frequency of background noise, $k_B$ represents the Boltzmann constant, T represents temperature in units of Kelvin, and h represents Planck's constant. In some cases, the temperature range for one or more components of the quantum processor cell can be guided by other considerations or formulas.

In some cases, signals are transferred between components of the quantum computing system on transmission lines or other types of signal lines. The quantum computing system may include signal lines that transfer signals between high and low temperature stages. In some instances, the signal lines extending from high to low temperature stages in a cryogenic apparatus can introduce a thermal shunt. Moreover, the cooling power at 10 mK may be less than 5 µW, and the signal delivery can be performed in architecture with hundreds, thousands or more qubit devices. To reduce the thermal bridging effects of transmission lines carrying DC, radio frequency, or microwave signals, a single transmission line may be used in some instances to deliver signals to multiple devices. In some cases, the signal line connects with a solid state switch, a switched filter bank, a power divider, a frequency multiplexer, or another device in the low temperature stage, and each input signal line bridging the temperature stage may divide into multiple signal distribution branches in the lower temperature stage, for example, to communicate with multiple devices.

The FPGA of each channel controller may be in real-time communication with the DLC. At each clock cycle, the FPGA in some or all of the channel controllers in the domain controller block can communicate to the DLC a status or measurement outcome, and can receive from the DLC instruction for subsequent execution. The FPGA may receive the instructions from the DLC and induce the DAC and ADC within the channel controller to produce or process signals that allow the system to perform quantum computation operations realizing those instructions. In some cases, the FPGA can implement Kalman filter digital signal processing techniques or other types of processes to optimize or otherwise improve the interpretation of qubit readout signals.

Each of the qubit devices can be a transmon qubit. Each of the qubit devices can be a charge qubit. Each of the qubit devices can be a flux qubit. Each of the qubit devices can be a fluxonium qubit. Each fluxonium qubit can include a topologically closed capacitance. The quantum computing system can include an electromagnetic waveguide system.

Implementations of any of the general aspects described in this document may include one or more of the following features. The input channels are configured to receive qubit readout signals from a group of readout devices housed in a quantum processor cell. Each readout device in the group has a distinct readout frequency. The multiplexer is configured to generate a multiplexed readout signal by multiplexing the qubit readout signals. The output channel is configured to communicate the multiplexed readout signal from the output signal processing system. The one or more data processors are operable to receive the multiplexed readout signal. The one or more data processors are operable to identify, from the multiplexed readout signal, qubit readout data for each qubit device in the group based on the distinct readout frequency of the readout device The one or more data processors are operable to prepare multiplexed quantum processor control information for the quantum processor cell based on the qubit readout data. The control system can be configured to operate at a first, higher temperature stage. The output signal processing system and the quantum processor cell can be configured to operate at a second, lower temperature stage. The first temperature stage can be a room temperature stage, and the second temperature stage can be a cryogenic temperature stage. The output signal processing system can be configured to process device control signals in a low-noise, cryogenic environment. The quantum computing system can include magnetic shielding material about the quantum processor cell and the output signal processing system. The qubit readout data for each respective device can corresponds to the qubit readout signal from the device. The output signal processing system can include a board that supports processing cards. The processing cards can be supported in receptacle slots defined in the board. The output signal processing system can include multiple output processing domains. Each output processing domain can include a respective subset of the processing cards. At least one of the processing cards in each output processing domain can be interchangeable with a corresponding processing card in another output processing domain. The quantum computing system can include a waveform generator configured to generate a multiplexed control signal from the multiplexed quantum processor control information and an input signal processing system. The input signal processing system can include: an input channel configured to receive the multiplexed control signal; a de-multiplexer configured to separate device control signals from the multiplexed control signal; and output channels configured to communicate the respective device control signals into the quantum processor cell. The quantum computing system can include an output interconnect system that includes output interconnect signal lines extending from an interior of the quantum processor cell to an exterior of the quantum processor cell. The output interconnect signal lines can be configured to communicate the qubit readout signals between the readout devices and the respective input channels of the output signal processing system. The output interconnect system can include plateau structures that support at least a portion of the output interconnect signal lines inside the quantum processor cell. The quantum computing system can include a signal board that supports the devices in the quantum processor cell and includes signal lines. The signal lines can be configured to route the qubit signals within the quantum processor cell from the respective readout devices. The quantum computing system can include the quantum processor cell and a group of qubit devices housed in the quantum processor cell. Each qubit device can have a respective qubit operating frequency. Each of the readout devices can be operably coupled to a single, respective one of the qubit devices. The qubit readout signal produced by each readout device can indicate a state of the qubit device to which the readout device is operably coupled. The quantum processor cell can include a multi-dimensional array of qubit devices. The multi-dimensional array can include sub-arrays associated with separate frequency bands. The qubit devices in each sub-array can have a qubit operating frequency within the frequency band associated with the sub-array. The qubit readout signals can be associated with a group of the qubit devices in the multi-dimensional array. The group of qubit devices can includes one qubit device in each of the sub-arrays. The output signal processing system can include filters, circulators and quantum amplifiers configured to process the qubit readout signals.

What is needed is a fast analog-to-digital converter that is integrated with a fast cryogenic optical demodulator, for converting a broadband optical signal to a multi-bit digital broadband superconducting signal.

SUMMARY AND OBJECTS OF THE INVENTION

In a preferred embodiment of an optical-to-digital converter, the converter comprises a voltage pulse generator, a pulse synchronizer, and a digital counter, as illustrated in FIG. 5. The voltage pulse generator generates a rapid sequence of voltage pulses, whereby the rate of pulse generation depends on the intensity of an optical signal that is coupled to the voltage pulse generator. The generator is configured so that in the absence of an optical signal, the pulse generation rate will be constant. In the general case where the intensity of the optical signal varies with time, the pulse output rate from the pulse generator will also vary with time, comprising an asynchronous pulse train, i.e., one where the intervals between the pulses vary with time. The optical signal therefore modulates the voltage pulse train, where the modulation may be viewed as a pulse time modulation or as a phase modulation. This effect of this is to produce a modulated pulse train that is similar to the phase modulation in a phase-modulation ADC of the prior art (FIG. 3). In order to demodulate the phase modulation, a synchronizer and integrator are required, as in the phase-modulation ADC.

The asynchronous pulse train of the pulse time modulated output may be sent to a synchronizer, a circuit driven by a fast sampling clock (i.e., a periodic voltage signal) that measures the presence of one or more input pulses within a clock interval. The synchronizer may be a one-bit synchronizer, or alternatively a multi-bit synchronizer.

In order to demodulate the modulated signal, the number of pulses from the generator in a given time interval is measured. This requires sending the signal from the synchronizer to a counter/integrator, which is reset by a trigger from a counting clock, and accumulates the synchronizer outputs until the next counting trigger. The counter may also suppress the baseline counts corresponding to zero optical intensity.

The output of the counter is a multi-bit digital signal that represents the optical input intensity. However, if the digital signal is oversampled relative to the highest frequency component present in the optical intensity (higher than the Nyquist frequency), additional bits of precision may be created by averaging the output of the counter for a longer time, corresponding to intervals defined by the averaging clock. In some cases, the functions of the counter and the averager may be combined into an integrated digital filter. In other cases, these digital processing functions may be partitioned into two or more modules that may be carried out on different substrates or using different digital logic technologies. Various topologies of digital filter may be implemented. See, en.wikipedia.org/wiki/Digital_filter; dsp-book.narod.ru/DSPCSP/20.pdf; calhoun.nps.edu/bitstream/handle/10945/28951/highspeedrecursi00loom.pdf; podelise.ru/tw_files/132/d-131687/7z-docs/1.pdf.

For example, some functions of the synchronizer, counter, and averager may be implemented using superconducting circuits similar to those in the phase-modulation demodulation ADC of FIG. 3. Other functions could be implemented using more conventional silicon technology on a DSP chip or FPGA (field programmable gate array), which may operate at room temperature.

FIGS. 6A and 6B show that there may be two general approaches, in any device technology, to optical modulation of a voltage pulse stream. A pulse generator is normally followed by a pulse propagation line, which functions as a delay line. In FIG. 6A, the optical signal directly alters the pulse generation rate. In FIG. 6B, the optical signal alters the time delay associated with the delay line.

As indicated in FIG. 7, an optical signal may either increase or decrease the effective pulse rate. Ideally, the modulation response should be linear with the optical intensity for at least a portion of the range. Nonlinearity may be accommodated through appropriate digital processing, but tends to cause mixing of different frequency components, which is undesirable.

In a preferred embodiment, the core elements of the optical-to-digital ADC comprise superconducting circuits based on Josephson junctions. For example, a Josephson junction may be responsive to an optical signal, which may alter its critical current $I_c$ or its effective resistance R (for currents $I \gg I_c$). FIG. 8A shows a symbolic representation of a variable Josephson junction, with an arrow across the junction. FIG. 8B is an I-V plot, which shows the change due to a progressive decrease in $I_c$ with increasing optical power. This may occur due to heating of the Josephson junction, since an increased temperature T is known to decrease $I_c$. However, equilibrium heating or cooling of an entire chip is likely to be too slow to be practical. Transient heating only of the conduction electrons in a superconducting ultrathin film may respond much more quickly on a time of nanoseconds down to picoseconds. If such a film is an electrode of a Josephson junction, "electron heating" will reduce $I_c$. For current $I<I_c$, a Josephson junction acts as a (nonlinear) inductance (or "kinetic inductance") of order $h/4\pi e I_c$ (where h=Planck's constant and e is the charge on the electron), so electron heating of a Josephson junction can act as a variable inductance. This is also true of a superconducting film below its critical current; it can act as a "kinetic inductance bolometer".

The superconducting optoelectronic modulator may be designed to be sensitive to very weak optical intensity, even down to that of a single photon. In this way, a superconducting optical-to-digital converter may be closely integrated with a superconducting detector or array of such detectors. This should enable compact and efficient direct digital readout of a sensitive focal-plane imaging system.

BRIEF DESCRIPTION OF THE DRAWINGS

FIG. 1A shows the circuit symbol together with the time-average voltage <V>, and FIG. 1B shows fast generation of voltage pulses V(t).

FIG. 5 shows a block diagram of a preferred embodiment of an optical-to-digital converter.

FIG. 7 shows examples of dependence of voltage pulse rate on optical intensity.

FIGS. 8A and 8B show a symbolic representation of a variable Josephson junction (FIG. 8A), and an I-V plot (FIG. 8B), where the critical current $I_c$ is dependent on optical intensity.

DETAILED DESCRIPTION OF THE PREFERRED EMBODIMENTS

FIGS. 1-4 describe prior-art technology of superconducting and optical devices that may be used in preferred embodiments of the proposed new optical-to-digital converter.

FIGS. 1A and 1B describe the electrical properties of a Josephson junction of the prior art, indicated in a circuit by an "X". A Josephson junction is a weak superconductor link connecting two superconducting wires. For a current below a characteristic critical current $I_c$ (which may be of order 0.1-1 mA), a Josephson junction acts as an ideal lossless superconductor. For larger currents, the Josephson junction develops a voltage and becomes resistive, with a typical resistance of order 1-10 ohms, as shown in the dc I-V curve of FIG. 1B.

Strictly speaking, the Josephson junction is a fast dynamic device, and the plot of FIG. 1B shows the instantaneous voltage V(t), which gives rise to the average voltage <V> in FIG. 1A. For current just above the critical current, V(t) corresponds to a series of fast voltage pulses, each pulse having integrated voltage of one flux quantum $\Phi_0$=h/2e=2.07 mV-ps. An actual SFQ (single-flux-quantum) pulse is rounded rather than rectangular (as in FIG. 1B) with a typical pulse height of order 1 mV, and effective pulse width of order 2 ps, depending on circuit parameters. The pulse frequency is f=<V>/$\Phi_0$.

A Josephson junction is also characterized by an effective capacitance C and nonlinear inductance $L_J$, where typically $L_J$~10 pH and C~1 pF. This would correspond to an LC resonator, except that it is damped by the resistance R. An underdamped Josephson junction tends to ring, and has an undesirable hysteretic I-V curve. An overdamped Josephson junction tends to have wide pulses, slowing down the dynamic operation. The optimum mode of operation is near critical damping, where the Q of the resonator is near 1. A physical Josephson junction may be based on a niobium tunnel junction, and tends to be underdamped. A practical Josephson junction may comprise a tunnel junction with a parallel resistive shunt added to bring the combined device near critical damping. The Josephson junctions discussed herein should be assumed to be damped junctions, which may include a resistive shunt. Other types of damping may be used.

Figure 1:
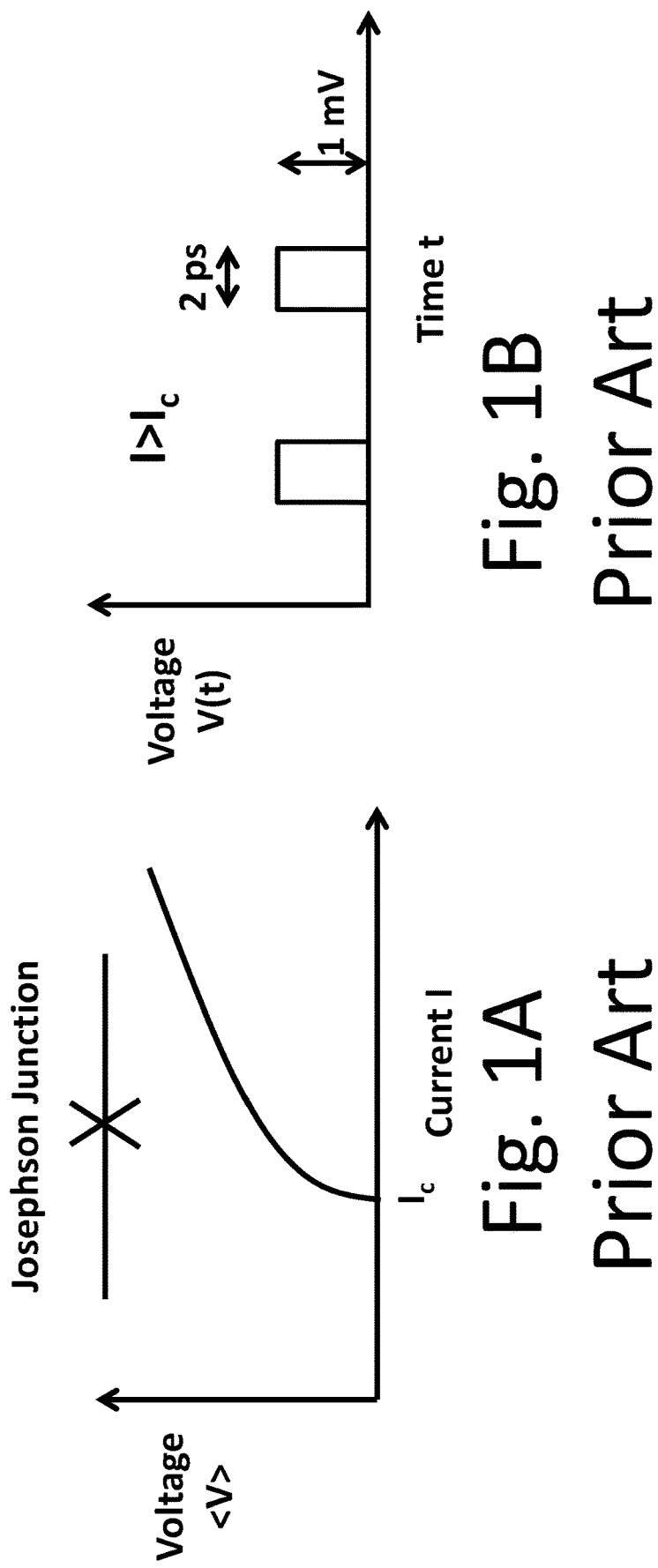
FIGS. 1A and 1B show the characteristics of a Josephson junction of the prior art.
Figure 2:
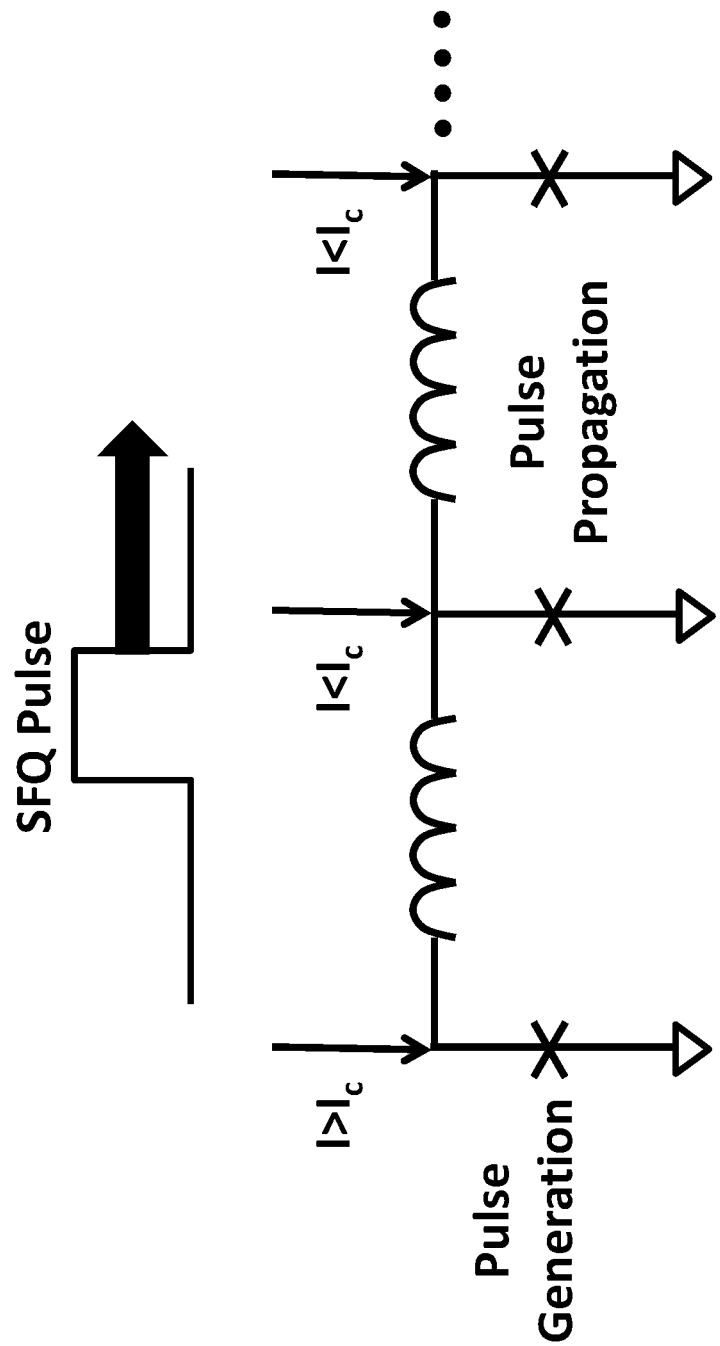
FIG. 2 shows a Josephson junction generator and pulse transmission line of the prior art.

FIG. 2 shows the operation of a Josephson transmission line of the prior art (see, for example, www.physics.sunysb.edu/Physics/RSFQ/Lib/PB/jtl.html), whereby a single SFQ pulse generated by the first Josephson junction on the left is regenerated by each junction in the sequence, thus propagating the pulse down the line. The generating junction is biased just above its critical current, while the propagating junctions are biased somewhat below their critical current (typically at ~70%). In addition to the Josephson junctions, the JTL comprises connecting inductances, where this inductance is a superconducting wire or microstripline. The inductance per stage is typically L=$\Phi_0$/$I_c$, since a larger inductance can cause an SFQ pulse to form a static trapped flux in the loop, rather than propagating. The propagation time through the JTL depends on both $I_c$ and L, and is typically several ps per stage. The JTL is a primary element used to connect gates in rapid-single-flux-quantum (RSFQ) logic, which may be applied to a preferred embodiment of the present invention.

Figure 3:
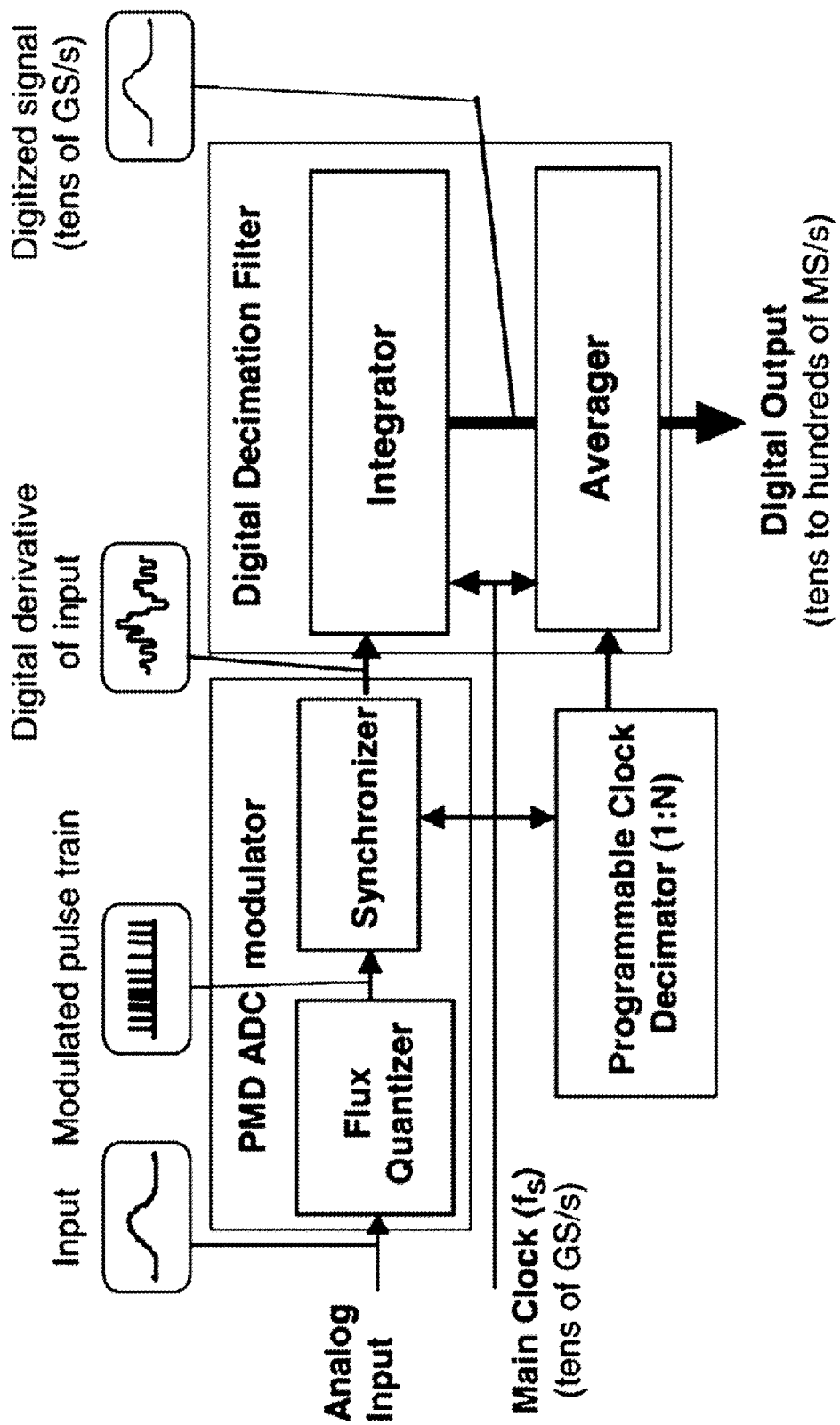
FIG. 3 shows a block diagram of a prior-art superconducting phase-modulation-demodulation analog-to-digital converter (ADC).

FIG. 3 shows a detailed block diagram of a phase-modulation-demodulation (PMD) ADC of the prior art. The preferred embodiment of this technology is based on RSFQ logic, but this could alternatively be implemented using another device technology. A rapidly varying analog signal (bandwidth up to ~1 GHz) enters on the left, and it modulates the pulse output of the "flux quantizer". A positive signal could increase the pulse rate, while a negative signal could decrease the rate. The resulting modulated pulse train enters the "synchronizer" block, which acts to demodulate the pulse sequence to recover a digital representation of the time-derivative of the input analog signal, at a sampling rate given by the main clock. For example, the unmodulated pulse rate could be 10 GHz, and the main clock could be 20 GHz. The quantizer and synchronizer together comprise the PMD ADC modulator. This derivative is then integrated (or summed) to regenerate a digital representation of the analog signal, and averaged to increase the effective number of bits and decrease the noise level. The clock for the integration and averaging may be a factor of N smaller than the main clock rate. The integrator and averager together may comprise a digital decimation filter. In a preferred embodiment, the ADC modulator and at least a portion of the digital decimation filter may be integrated on the same chip. The optical-to-digital converter of the present invention may employ some similar circuits to those in the phase modulation-demodulation analog-to-digital converter (PMD ADC).

Figure 4:
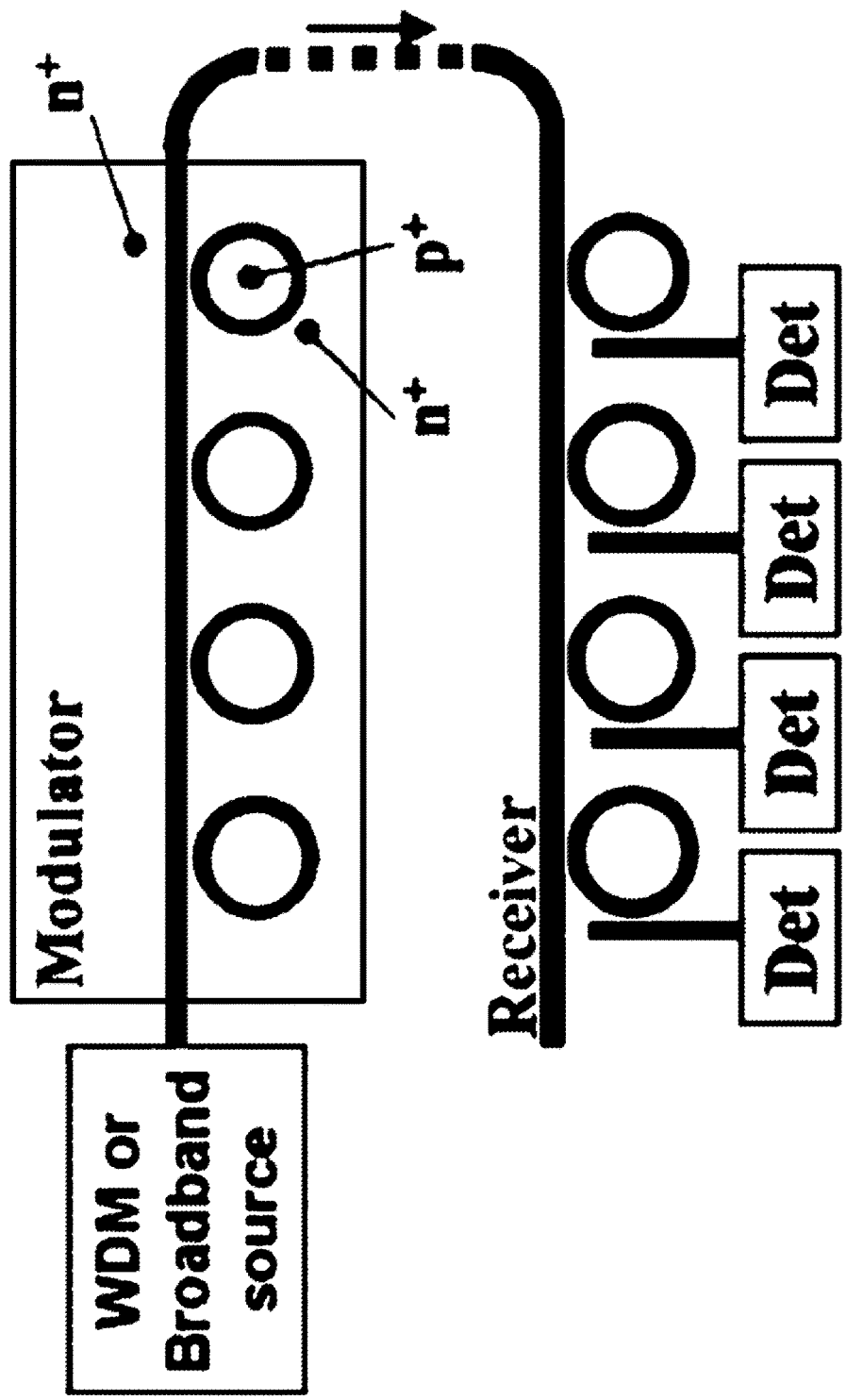
FIG. 4 shows a conceptual diagram of prior-art micro-ring optical resonators for a multiplexer and demultiplexer of a wavelength-division multiplexed (WDM) optical signal.

FIG. 4 presents a conceptual diagram of a wavelength-division multiplexed (WDM) optical communication system of the prior art. In this example, the transmitter comprises an optical carrier signal that is modulated by four separate electrical signals, preferably at slightly different wavelengths so as not to interfere. At the receiver, these four electrical signals are separated using a demultiplexer, and detected in parallel. The multiplexer and demultiplexer may comprise an array of integrated optical ring resonators, coupled to optoelectronic modulators.

FIG. 5 shows a block diagram of a preferred embodiment of the optical-to-digital converter of the invention. A voltage pulse generator is modulated by an optical source. The asynchronous pulse train is then synchronized, integrated, and averaged in much the same way as PMD ADC. The unmodulated pulse rate might be 10 GHz, and the sampling clock might be twice this or 20 GHz. The integrator and averager could be combined into a single digital filter, or split into stages that are done in different technologies. The averaging clock $f_{av}$ determines the effective bandwidth of the digitizer; by the Nyquist relation, $BW=f_{av}/2$.

Figure 6B:
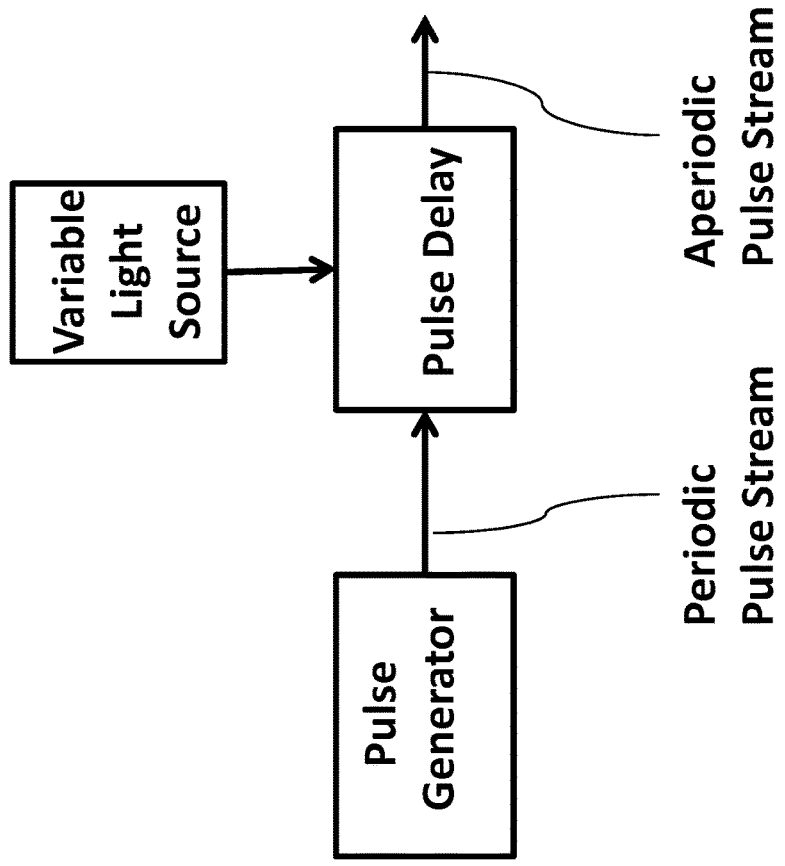
FIGS. 6A and 6B shows block diagrams of two alternative embodiments of an optically modulated voltage pulse generator: a direct optical pulse-rate modulator (FIG. 6A), and an optically modulated pulse delay (FIG. 6B).
Figure 6A:
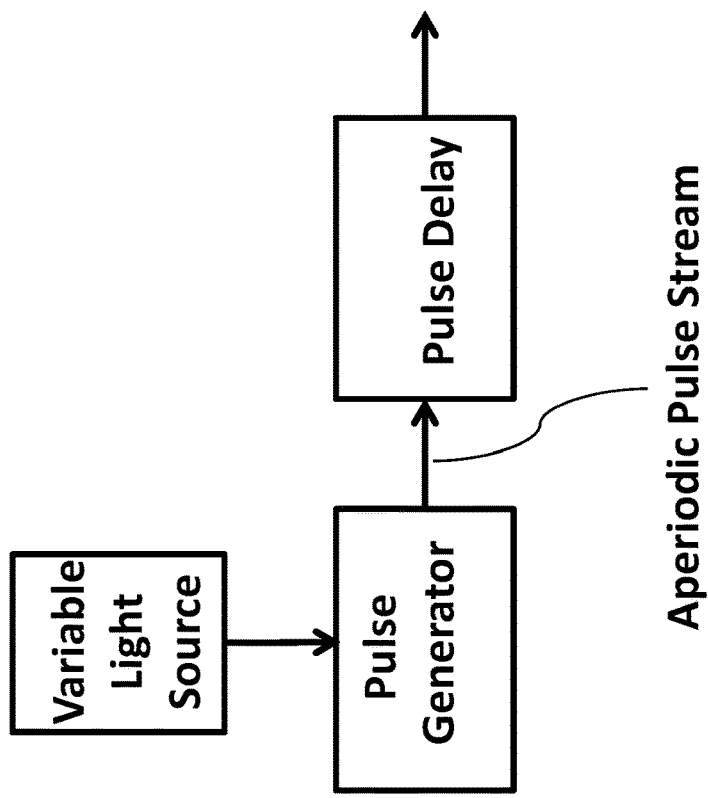

FIGS. 6A, 6B, and 7 address in general terms how a digital optical modulator might work. Either the pulse rate could be directly modulated by the light, or the pulse delay could be modulated by the light. FIG. 6A shows a mode whereby the pulse rate is directly modulated by the optical input. The pulse rate might either increase or decrease with increasing optical power, as shown in FIG. 7. In ideal cases, the change in the pulse rate ΔR may be linearly proportional to the optical power P. Linearity is preferred in communication systems, because nonlinearity tends to produce frequency mixing, generating frequency components where they would not otherwise be present. An alternative to direct optical modulation is shown in FIG. 6B, where the pulse delay associated with pulse propagation is either advanced or retarded by the optical power. In this case, a constant optical power would not change the average pulse rate, but a transient change in optical power dP/dt would cause a proportional change in pulse rate ΔR. In either case, the digital representation of the optical power P(t) could be recovered, but the appropriate digital processing would differ.

FIG. 8A shows a symbol for a variable Josephson junction (a line with an arrow passing through the "X"), whereby at least one of the junction parameters could change under optical illumination. In one embodiment shown in the set of I-V curves in FIG. 8B, the critical current $I_c$ of the junction is decreased under optical illumination. For a fixed bias current with $I>I_c$, a decrease in $I_c$ would cause an increase in voltage, and hence an increase in the generator pulse rate. For a current bias with $I<I_c$, a small optical power will change the current-dependent Josephson inductance, which can change the delay of a junction in pulse-propagating mode. Alternatively, in another embodiment, the junction resistance could change due to optical illumination, which could also change the pulse generation rate for $I>I_c$. There may be several mechanisms that could cause optical modulation in a Josephson junction. The critical current is normally a function of temperature, so that any type of nonequilibrium heating would also cause $I_c$ to decrease. Alternatively, optical illumination might affect the tunnel barrier connecting the two superconducting electrodes, which could affect both $I_c$ and R.

Figure 9:
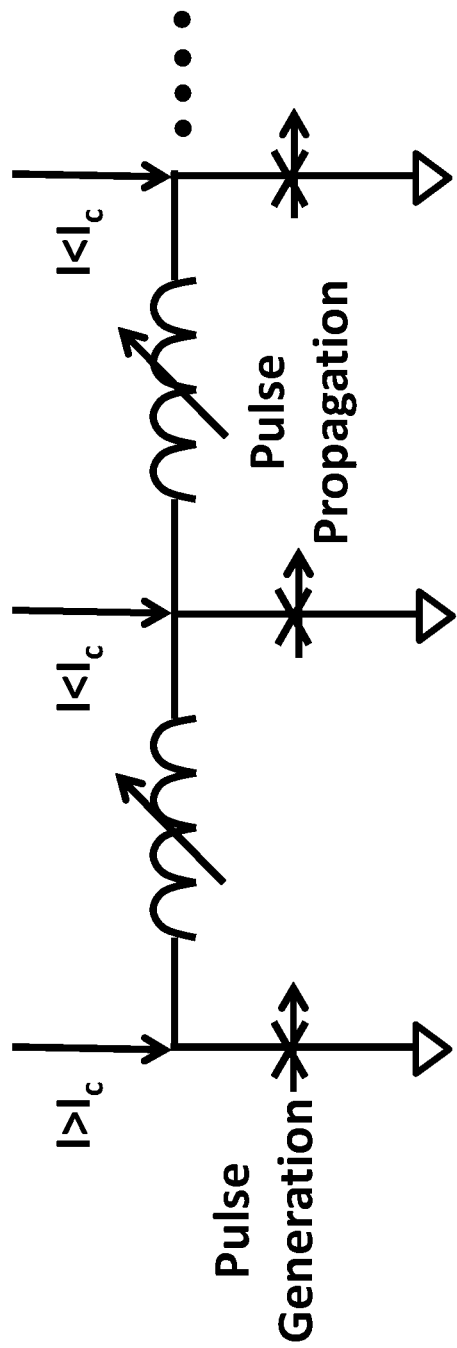
FIG. 9 shows a Josephson pulse generation/propagation circuit, where one or more Josephson junctions and/or inductors may be optically varied.

FIG. 9 shows the prior-art Josephson transmission line, where now one or more elements can be modulated by optical illumination, which could modulate the pulse generation rate, and/or the pulse delay rate. The modulated elements could include a Josephson junction, as well as a connecting superconducting inductor. A ring oscillator configuration may also be implemented.

A superconducting inductor will include at least a portion of its inductance as "kinetic inductance" associated with kinetic energy stored in the superconducting charge carriers. The kinetic inductance is dependent on temperature, and therefore on any nonequilibrium heating that affects the superconducting electrons. A very thin superconducting film of thickness $d<\lambda_L$ (the magnetic penetration depth of the superconductor) exhibits an enhanced kinetic inductance. Specifically, the kinetic inductance of a thin film per square is $\mu_0\lambda_L^2/d$. So for example, if d=10 nm and $\lambda_L$=100 nm, the kinetic inductance is of order 1 pH/square, and tends to dominate the usual magnetic inductance.

Figure 10A:
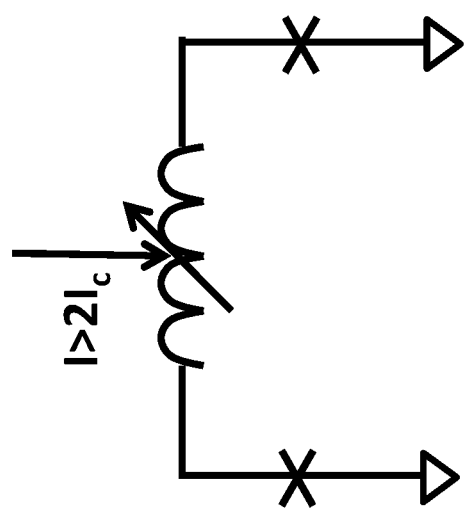
FIGS. 10A and 10B show alternative embodiments of a variable Josephson pulse generator.
Figure 10B:
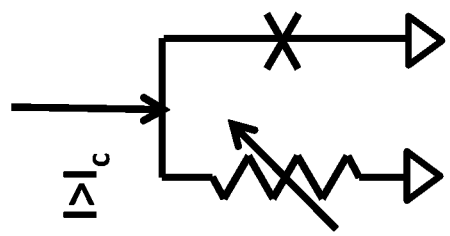

FIGS. 10A and 10B show how optical illumination may affect other superconducting circuit elements. FIG. 10A represents a SQUID, comprising two Josephson junctions in an inductive loop. The SQUID is equivalent to a single Josephson junction with a variable critical current. Even if the critical currents of the component junctions remain unchanged, the critical current of the SQUID is dependent on the flux contained in the superconducting loop. The flux can be varied by varying the loop inductance, which may be sensitive to optical illumination.

FIG. 10B represents a resistively shunted Josephson junction with an optically sensitive shunt resistance. This resistance might comprise a superconducting film with a critical temperature $T_c$ smaller than that of the Josephson junction. For example, the Josephson junction and connecting inductors might comprise niobium (Nb) with critical temperature $T_c$=9.2 K, while the resistor might comprise tantalum (Ta) with $T_c$=4.3 K. If the operating temperature is close to $T_c$ of the Ta film, its resistance will be sensitive to optical illumination that may produce transient heating. In these ways, these circuits can be used to create variable pulse generating or propagating elements.

Figure 11:
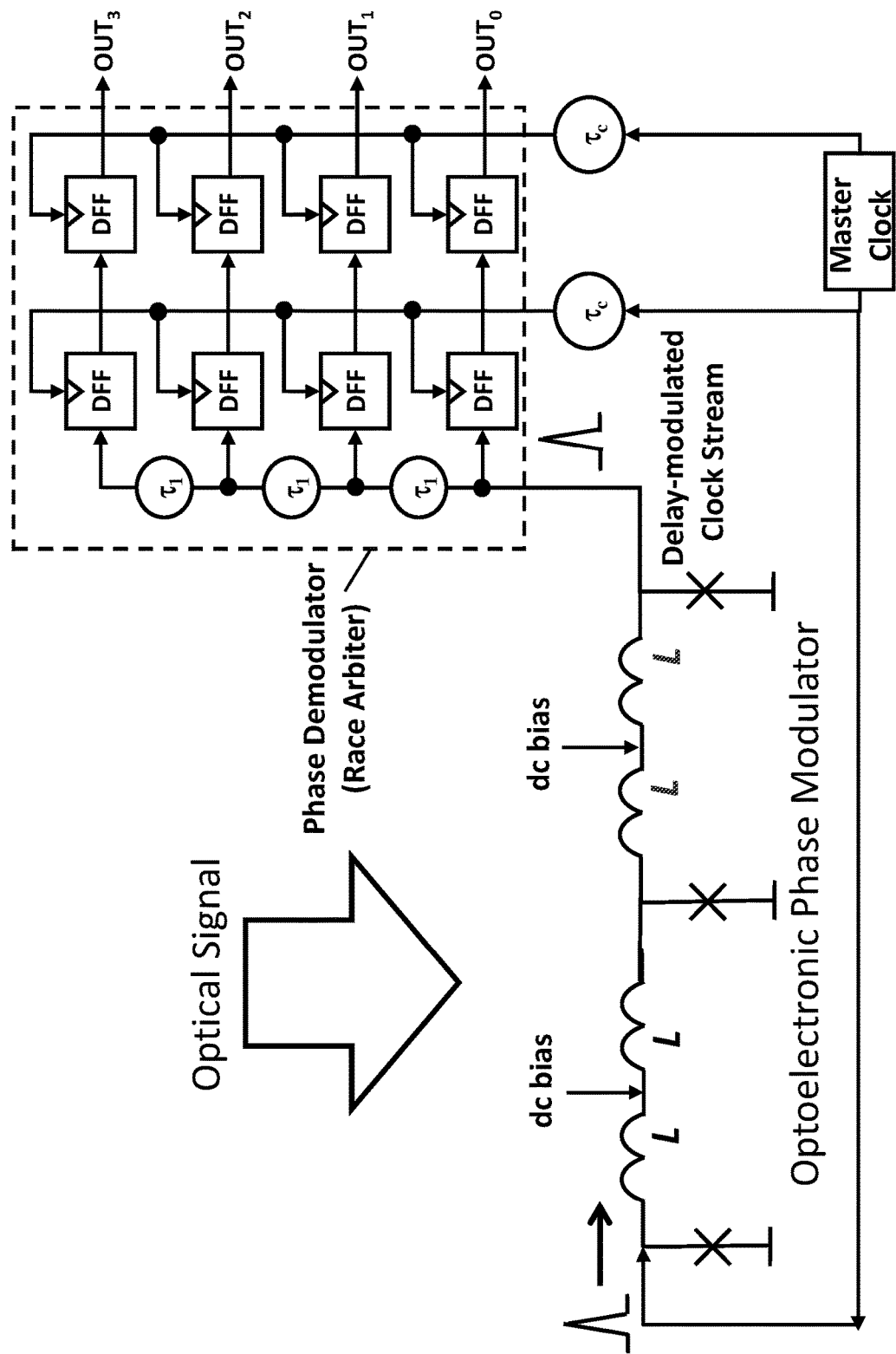
FIG. 11 shows a circuit diagram of one embodiment of Josephson delay line and synchronizer circuit for a superconducting optical-to-digital converter.

FIG. 11 shows a detailed circuit diagram of one preferred embodiment of a PMD optical modulator using RSFQ logic, similar in part to the PMD modulator of FIG. 3. The master clock generates a periodic pulse stream, which is fed to one or more JTL sections. Each section provides a small time delay, and these time delays may be modulated by light incident on one or more of the elements, either the Josephson junctions or the inductors. This represents a delay-type modulator, as shown in FIG. 6B. The asynchronous delay-modulated pulse stream then enters the synchronizer, which is labeled here as a race-arbiter-type phase demodulator. This synchronizer, quite similar to those in prior-art PMD ADCs, uses a set of data-flip-flops (DFF) to compare the arrival of clock pulses and data pulses. The DFF is a standard RSFQ cell that is also known as an RS flip-flop (for reset-set). See, for example, www.physics.sunysb.edu/Physics/RSFQ/Lib/AR/dff.html. This circuit is a multichannel synchronizer that uses a set of calibrated time delays (based on JTLs) to subdivide the clock period into 4 quantization levels, thus increasing the timing precision and increasing the effective resolution of the ADC.

Figure 12:
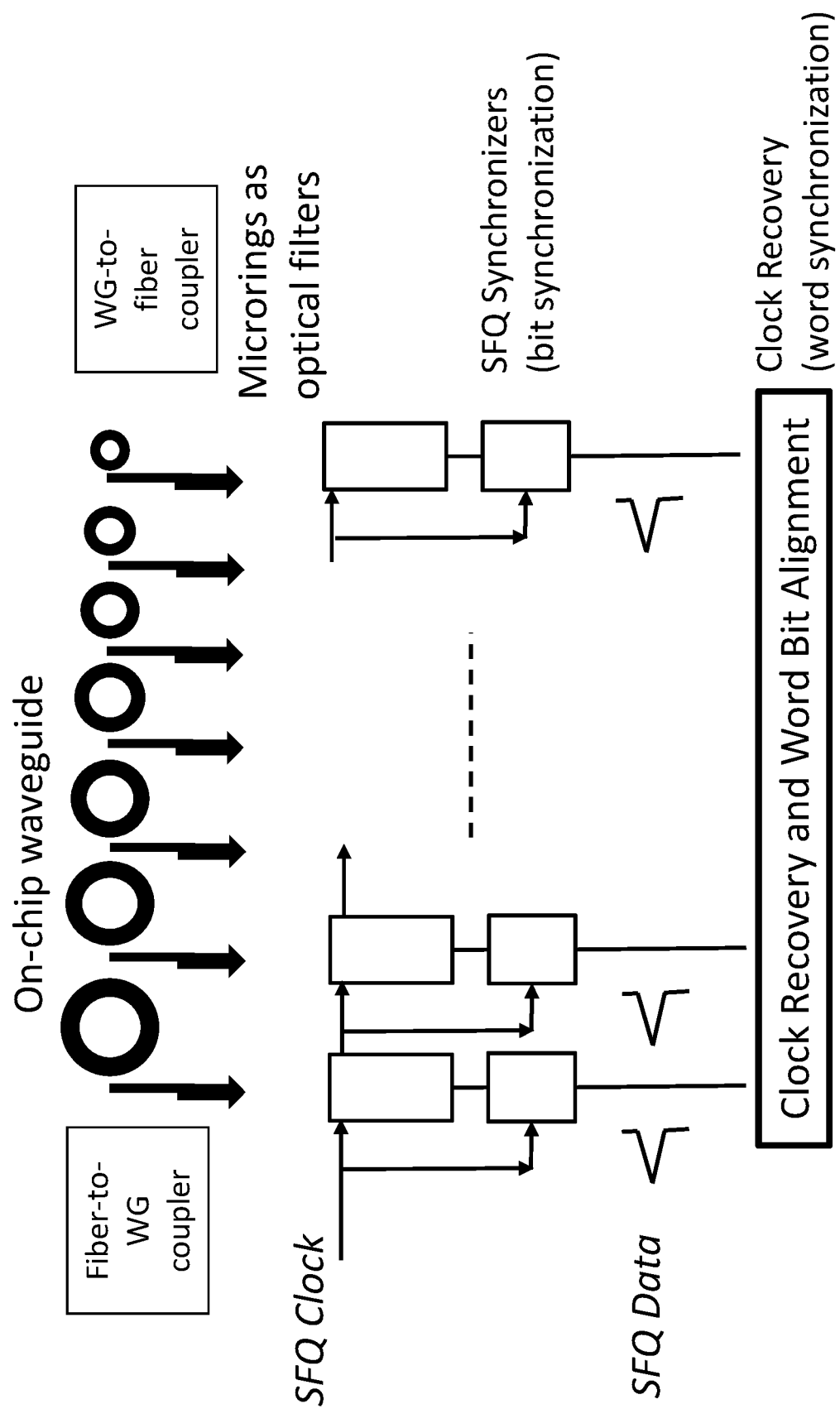
FIG. 12 shows a conceptual diagram of an integrated optical demultiplexer and array of superconducting optical-to-digital converters for a WDM optical signal.

FIG. 12 shows a conceptual diagram of an integrated multi-channel optical-to-digital receiver. This would be relevant for receiving and digitizing a WDM optical signal, comprising multiple signals modulated at slightly different wavelengths. The figure shows a demultiplexer that permits each signal to be coupled out using a set of integrated microring resonant waveguides. The waveguides are resonant for each wavelength, indicated in the figure by different size rings. Each of the wavelengths is coupled to a superconducting optical-to-digital converter, and each of the digital signals is sent out in parallel. In a preferred embodiment, both the demultiplexer array and the ADC array could be integrated on the same chip.

In order to correlate the various signals at their proper times, FIG. 12 also shows a clock recovery and word bit alignment circuit, also known as word synchronization.

Figure 13:
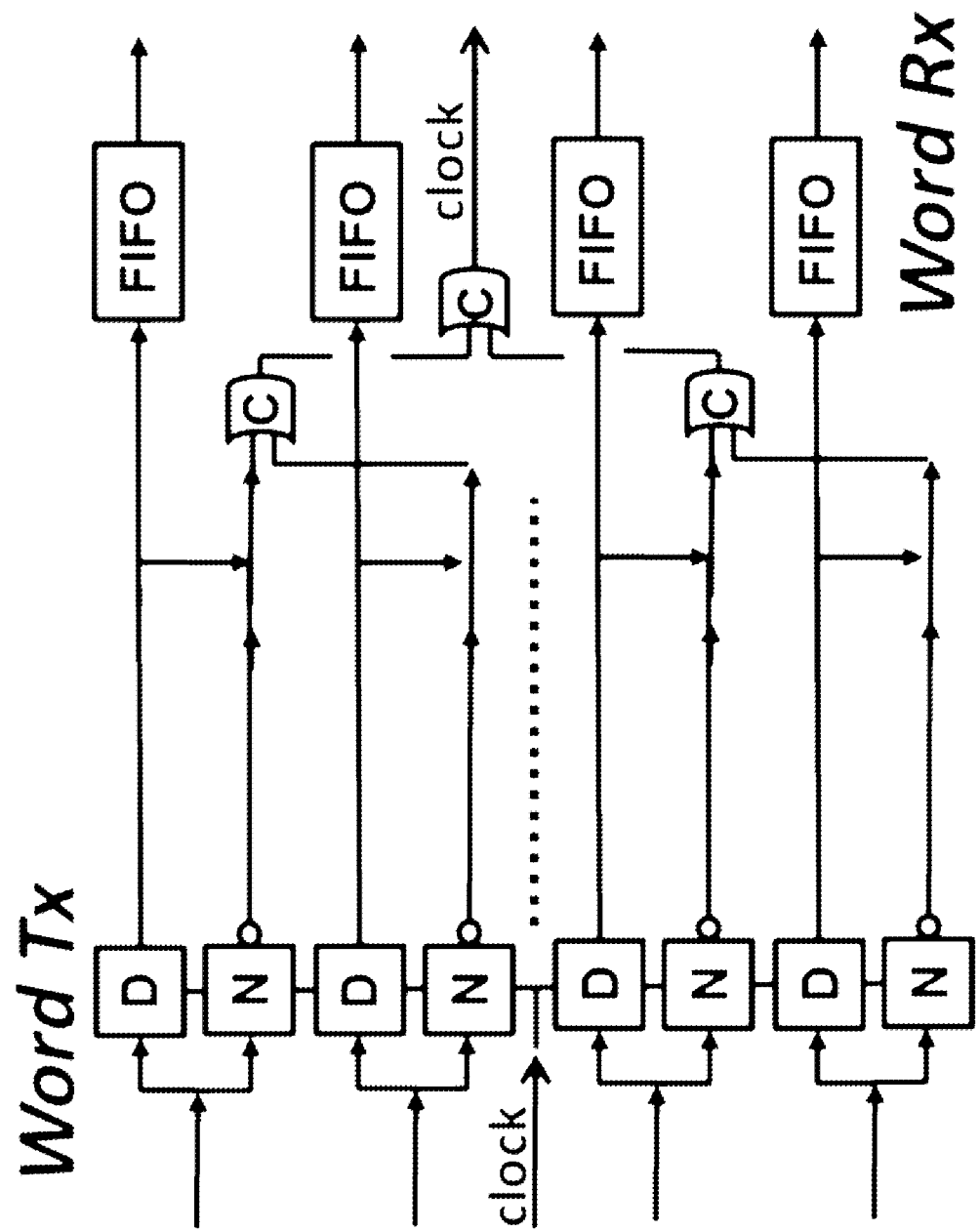
FIG. 13 shows a block diagram for a clock recovery and word bit alignment circuit that may be used with an array of optical-to-digital converters such as that in FIG. 12.

FIG. 13 shows one preferred embodiment of a word synchronization circuit, comprising a word transmit circuit on the chip, and a word receive circuit some distance away. Word synchronization circuits are known in other technologies, and are disclosed for RSFQ circuits in U.S. Pat. No. 9,520,180. In FIG. 13, D is the D-flip-flop, N is the inverter, C is the Muller C-element, and FIFO is a first-in-first-out shift register, all of which are standard RSFQ cells.

Such a superconducting optical-to-digital converter may be applied to general optical fiber communication systems, or alternatively to data transfer to other superconducting or cryogenic circuits. Such superconducting or cryogenic circuits may include RSFQ computing systems, cryogenic detector arrays, or cryogenic implementations of quantum computing. In many cases, signal bandwidths in excess of 1 GHz, or even in excess of 10 GHz, may be required. RSFQ digital processing is capable of these data rates, and properly implemented optoelectronic superconducting modulators also have sufficient bandwidth. For example, ultrathin superconducting films can change the effective electron temperature at GHz frequencies, without producing wider heating that would slow the response.

The embodiments presented here are not exclusive, but are used to illustrate the range of circuits and devices that may be functional components of superconducting optical-to-digital converters.

There has thus been shown and described systems and methods for optical-to-digital conversion which fulfill all the objects and advantages sought therefor. Many changes, modifications, variations, combinations, subcombinations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. A transducer for receiving an optical signal and generating a digital representation of information modulated on the optical signal having a modulation bandwidth, comprising:
   at least one optically-responsive superconductor circuit comprising an optically-responsive Josephson junction, configured to produce an asynchronous pulsatile electronic signal having a constant pulse rate in an absence of perturbation, and to have a variable pulse rate in excess of the modulation bandwidth corresponding to an intensity modulation of the optical signal;
   a synchronizer, configured to synchronize pulses of the pulsatile electronic signal with a clock; and
   a digital circuit configured to convert the synchronized pulsatile electronic signal into a multibit digital representation of the information.

2. The transducer according to claim 1, wherein the optical signal is generated based on a quantum computing operation of a qubit.

3. The transducer according to claim 1, wherein the digital circuit is further configured to use the multibit digital representation of the information to control a qubit.

4. The transducer according to claim 1, wherein the digital circuit comprises a plurality of Josephson junctions and a clock input, configured to perform clocked digital logic functions based on single-flux-quantum (SFQ) pulses.

5. The transducer according to claim 4, wherein the plurality of Josephson junctions are configured as rapid single flux quantum logic.

6. The transducer according to claim 1, wherein the information modulated on the optical signal has a bandwidth of at least 1 GHz.

7. The transducer according to claim 1, further comprising a plurality of qubits operating at a first cryogenic temperature, and a superconducting classical control chip comprising the synchronizer and the digital circuit operating at a second temperature, different from the first cryogenic temperature.

8. The transducer according to claim 1, wherein the variable pulse rate is linearly responsive to changes in intensity of the optical signal.

9. The transducer according to claim 1, wherein the optical signal is modulated with a multiplexed plurality of information streams, further comprising an optical demultiplexer configured to demultiplex the multiplexed plurality of information streams of the optical signal.

10. The transducer converter according to claim 9, wherein the optical demultiplexer comprises a plurality of microring resonant waveguides.

11. The transducer according to claim 9, wherein the multiplexed information streams are wavelength division multiplexed on the optical signal.

12. The transducer according to claim 11,
   further comprising a respective microring resonant waveguide for each respective modulated wavelength of the wavelength division multiplexed information streams on the optical signal,
   wherein each respective microring resonant waveguide has a respective optically-responsive superconductor circuit,
   each respective optically-responsive superconductor circuit comprising an optically-responsive Josephson junction configured to produce a respective synchronous pulsatile electronic signal corresponding to a modulation of portion of the optical signal with a respective multiplexed information stream, a respective synchronizer and a respective digital circuit configured to convert the respective synchronous pulsatile electronic signal into a multibit digital representation of the respective multiplexed information stream.

13. The transducer according to claim 1, wherein the optical signal is modulated with a plurality of respective multiplexed information streams representing signals from a plurality of respective qubits, multiplexed at different respective optical frequencies.

14. The transducer according to claim 1, wherein the optically-responsive superconductor circuit comprises a kinetic inductance bolometer.

15. A method for transducing an optical signal to a digital representation of information modulated on the optical signal having a modulation bandwidth, comprising:
   producing an asynchronous pulsatile electronic signal corresponding to a modulation of the optical signal and having a constant pulse rate in an absence of perturbation, and a variable pulse rate in excess of the modulation bandwidth when subject to perturbation by the optical signal, with at least one optically-responsive superconductor circuit comprising an optically-responsive Josephson junction;
   synchronizing the asynchronous pulsatile electronic signal with a clock signal with a clocked synchronizer; and converting the synchronized pulsatile electronic signal into a multibit digital representation of the information with a clocked digital circuit.

16. The method according to claim 15, wherein the optical signal is generated based on a quantum computing operation of a qubit.

17. The method according to claim 16, further comprising controlling the qubit with the multibit digital representation of the information.

18. The method according to claim 16, wherein the variable pulse rate is linearly responsive to changes in intensity of the optical signal.

19. The method according to claim 16,
further comprising demultiplexing a plurality of frequency-multiplexed information streams of the optical signal with a plurality of microring resonant waveguides, each respective microring resonant waveguide having an associated respective optically-responsive superconductor circuit,
each respective optically-responsive superconductor circuit comprising a respective optically-responsive Josephson junction configured to produce an asynchronous pulsatile electronic signal corresponding to a modulation of the optical signal with a respective multiplexed information stream, a respective clocked synchronizer configured to synchronize pulses of the respective asynchronous pulsatile electronic signal with a clock signal, and a respective digital circuit configured to convert the respective synchronized pulsatile electronic signal into a multibit digital representation of the respective frequency-multiplexed information stream.

20. A transducer for receiving a wavelength division multiplexed optical signal and generating digital representation of information modulated on different channels of the wavelength division multiplexed optical signal, comprising:
a plurality of microring resonators, each microring resonator having a respective resonance to allow a respective channel of the wavelength division optical signal at a respective wavelength and having a modulation bandwidth; and
a plurality of optically-responsive superconductor circuits, each respective optically-responsive superconductor circuit being associated with a respective microring resonator,
each respective optically-responsive superconductor circuit comprising:
an optically-responsive Josephson junction, configured to receive the allowed respective channel of the wavelength division optical signal of a respective microring resonator and, to produce an asynchronous pulsatile electronic signal having a constant pulse rate in an absence of optical signal intensity, and a variable pulse rate in excess of the modulation bandwidth of a respective channel of the wavelength division multiplexed optical signal and corresponding to the information modulated on the respective channel of the wavelength division multiplexed optical signal;
a clocked synchronizer having a synchronized pulsatile electronic signal output; and
a digital circuit configured to convert the synchronized pulsatile electronic signal output into a multibit digital representation of the information modulated on the respective channel of the wavelength division multiplexed optical signal.

* * * * *